US012803520B2

(12) United States Patent
Campanella-Pineda et al.

(10) Patent No.: US 12,803,520 B2
(45) **Date of Patent: *Nov. 17, 2026**

(54) BULK ACOUSTIC WAVE DEVICE WITH OVERTONE MODE

(71) Applicant: Skyworks Solutions, Inc., Irvine, CA (US)

(72) Inventors: Humberto Campanella-Pineda, Singapore (SG); Guofeng Chen, Fremont, CA (US); You Qian, Singapore (SG); Rakesh Kumar, Singapore (SG)

(73) Assignee: Skyworks Solutions, Inc., Irvine, CA (US)

( * ) Notice: Subject to any disclaimer, the term of this patent is extended or adjusted under 35 U.S.C. 154(b) by 74 days.

This patent is subject to a terminal disclaimer.

(21) Appl. No.: 18/636,056

(22) Filed: Apr. 15, 2024

(65) Prior Publication Data

US 2024/0364298 A1 Oct. 31, 2024

Related U.S. Application Data

(60) Provisional application No. 63/498,394, filed on Apr. 26, 2023, provisional application No. 63/498,391, filed on Apr. 26, 2023.

(51) Int. Cl.

| | |
|---|---|
| ***H03H 9/02*** | (2006.01) |
| ***H03H 9/17*** | (2006.01) |
| ***H03H 9/56*** | (2006.01) |

(52) U.S. Cl.

CPC .... *H03H 9/02102* (2013.01); *H03H 9/02015* (2013.01); *H03H 9/02157* (2013.01); *H03H 9/173* (2013.01); *H03H 9/176* (2013.01); *H03H 9/568* (2013.01)

(58) Field of Classification Search

CPC ........... H03H 9/02102; H03H 9/02015; H03H 9/02157; H03H 9/173; H03H 9/176; H03H 9/568; H03H 9/0207

USPC .................................................. 333/186–188

See application file for complete search history.

(56) References Cited

U.S. PATENT DOCUMENTS

| | | | |
|---|---|---|---|
| 11,818,540 | B1 | 11/2023 | Qian et al. |
| 11,923,822 | B2 | 3/2024 | Maki et al. |
| 12,081,189 | B2 | 9/2024 | Maki et al. |
| 12,149,224 | B2 | 11/2024 | Maki et al. |
| 2009/0045704 | A1 | 2/2009 | Barber et al. |

(Continued)

*Primary Examiner* — Jorge L Salazar, Jr.
(74) *Attorney, Agent, or Firm* — VIA LLP

(57) ABSTRACT

A bulk acoustic wave device that is configured to excite an overtone mode as a main mode is disclosed. The bulk acoustic wave device can include a first electrode, a piezoelectric layer, a second electrode, and at least one temperature compensation layer. The piezoelectric layer is positioned over the first electrode. The second electrode is positioned such that the piezoelectric layer is located between the first and second electrodes. The at least one temperature compensation layer is configured to provide temperature compensation for the bulk acoustic wave device. The at least one temperature compensation layer has a thickness that is a multiple of one thirty-second of a wavelength of an acoustic wave propagating through the at least one temperature compensation layer. The bulk acoustic wave device is configured to excite the overtone mode as the main mode.

20 Claims, 15 Drawing Sheets

(56) References Cited

U.S. PATENT DOCUMENTS

| | | | | |
|---|---|---|---|---|
| 2021/0058054 | A1* | 2/2021 | Kaajakari .......... | H03H 9/02078 |
| 2022/0263495 | A1 | 8/2022 | Wang et al. | |
| 2022/0321095 | A1 | 10/2022 | Liu et al. | |
| 2022/0321100 | A1 | 10/2022 | Liu et al. | |
| 2022/0321101 | A1 | 10/2022 | Liu et al. | |
| 2022/0402751 | A1 | 12/2022 | Chen et al. | |
| 2022/0407494 | A1* | 12/2022 | Peng .................. | H03H 9/02228 |
| 2022/0408208 | A1 | 12/2022 | Chen et al. | |
| 2023/0081056 | A1 | 3/2023 | Qian et al. | |
| 2023/0103956 | A1 | 4/2023 | Fukuhara et al. | |
| 2023/0104500 | A1 | 4/2023 | Fukuhara et al. | |
| 2023/0105034 | A1 | 4/2023 | Fukuhara et al. | |
| 2023/0107728 | A1 | 4/2023 | Fukuhara et al. | |
| 2023/0107820 | A1 | 4/2023 | Fukuhara et al. | |
| 2023/0108686 | A1 | 4/2023 | Fukuhara et al. | |
| 2023/0108824 | A1 | 4/2023 | Bader et al. | |
| 2023/0109080 | A1 | 4/2023 | Bader et al. | |
| 2023/0109569 | A1 | 4/2023 | Bader et al. | |
| 2023/0111476 | A1 | 4/2023 | Fukuhara et al. | |
| 2023/0125523 | A1 | 4/2023 | Qian et al. | |
| 2023/0130082 | A1 | 4/2023 | Qian et al. | |
| 2023/0135200 | A1 | 5/2023 | Qian et al. | |
| 2023/0136347 | A1 | 5/2023 | Qian et al. | |
| 2023/0327635 | A1 | 10/2023 | Hill et al. | |
| 2023/0353119 | A1 | 11/2023 | Hill et al. | |
| 2024/0039516 | A1 | 2/2024 | Goto et al. | |
| 2024/0364297 | A1 | 10/2024 | Campanella-Pineda et al. | |

* cited by examiner

| $SiO_2$ THICKNESS SENSITIVITY: 5nm | BAW DEVICE 10 | THIN BAW DEVICE |
|---|---|---|
| TC THICKNESS VARIATION % | 1.2-5.0% | 20-50% |
| TCF VARIATION ppm/°C | <1ppm/°C | ±5 ppm/°C |
| TCF VARIATION % | <10% (REF.-10ppm/°C) | 50% (REF.-10ppm/°C) |
| $kt^2$ VARIATION (ABSOLUTE) | FROM 2.9% TO 3.1% | FROM 1.09% TO 4.44% |
| $kt^2$ VARIATION % | <0.1% FOR $kt^2$=3.0% | 40-60% |
| TC ROLE IN MODE SHAPE | ACTIVE/INCREMENTAL | PASSIVE/DETRIMENTAL |

FIG.2

BULK ACOUSTIC WAVE DEVICE WITH OVERTONE MODE

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 63/498,391, filed Apr. 26, 2023, titled "OVERTONE MODE ACOUSTIC WAVE DEVICE WITH TEMPERATURE COMPENSATION LAYER," and U.S. Provisional Patent Application No. 63/498,394, filed Apr. 26, 2023, titled "BULK ACOUSTIC WAVE DEVICE WITH OVERTONE MODE," are hereby incorporated by reference under 37 CFR 1.57 in their entirety.

BACKGROUND

Technical Field

Embodiments of this disclosure relate to acoustic wave devices, such as bulk acoustic wave devices, with an overtone mode.

Description of Related Technology

An acoustic wave filter can include a plurality of resonators arranged to filter a radio frequency signal. Example acoustic wave filters include surface acoustic wave (SAW) filters and bulk acoustic wave (BAW) filters. BAW filters include BAW resonators. Example BAW resonators include film bulk acoustic wave resonators (FBARs) and solidly mounted resonators (SMRs). In BAW resonators, acoustic waves propagate in a bulk of a piezoelectric layer.

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer.

It can be challenging to achieve a relatively high resonant frequency (e.g., a resonant frequency of over 6 gigahertz (GHz)) for an acoustic wave resonator. Acoustic wave resonators with high frequencies can be desirable for filtering certain radio frequency signals.

SUMMARY

The embodiments described in the claims each have several aspects, no single one of which is solely responsible for its desirable attributes. Without limiting the scope of the claims, some prominent features of this disclosure will now be briefly described.

In some aspects, the techniques described herein relate to a bulk acoustic wave device with an overtone mode as a main mode, the bulk acoustic wave device including: a first electrode; a second electrode; a piezoelectric layer positioned between the first electrode and second electrode; and at least one temperature compensation layer positioned between the first and second electrodes, a total thickness of the piezoelectric layer and the at least one temperature compensation layer being sufficiently thick to excite the overtone mode as the main mode of the bulk acoustic wave device.

In some embodiments, the techniques described herein relate to a bulk acoustic wave device wherein a thickness of the at least one temperature compensation layer is a multiple of one thirty-second a wavelength of an acoustic wave propagating in the at least one temperature compensation layer.

In some embodiments, the techniques described herein relate to a bulk acoustic wave device wherein a thickness of the piezoelectric layer is greater than a thickness of the at least one temperature compensation layer.

In some embodiments, the techniques described herein relate to a bulk acoustic wave device wherein the thickness of the piezoelectric layer is a multiple of one sixteenth a wavelength of an acoustic wave propagating in the piezoelectric layer.

In some embodiments, the techniques described herein relate to a bulk acoustic wave device wherein the thickness of the at least one temperature compensation layer is sufficiently thick to provide a temperature coefficient of frequency in a range of −2 ppm/° C. to −19 ppm/° C.

In some embodiments, the techniques described herein relate to a bulk acoustic wave device wherein the thickness of the at least one temperature compensation layer is sufficiently thick to provide the temperature coefficient of frequency in a range of −10 ppm/° C. to −15 ppm/° C.

In some embodiments, the techniques described herein relate to a bulk acoustic wave device wherein the at least one temperature compensation layer is a silicon oxide layer.

In some embodiments, the techniques described herein relate to a bulk acoustic wave device wherein the piezoelectric layer includes aluminum nitride.

In some embodiments, the techniques described herein relate to a bulk acoustic wave device wherein the piezoelectric layer is a scandium doped aluminum nitride layer.

In some embodiments, the techniques described herein relate to a bulk acoustic wave device wherein a resonant frequency of the overtone mode is in a range from 5 gigahertz to 12 gigahertz.

In some embodiments, the techniques described herein relate to a bulk acoustic wave device wherein the at least one temperature compensation layer is in physical contact with the second electrode and the piezoelectric layer.

In some embodiments, the techniques described herein relate to a bulk acoustic wave device wherein the at least one temperature compensation layer includes a first temperature compensation layer positioned between the second electrode and the piezoelectric layer and a second temperature compensation layer positioned between the first electrode and the piezoelectric layer.

In some embodiments, the techniques described herein relate to a bulk acoustic wave device wherein the second temperature compensation layer is in physical contact with the first electrode and the piezoelectric layer.

In some embodiments, the techniques described herein relate to a bulk acoustic wave device wherein the overtone mode is a second overtone mode.

In some aspects, the techniques described herein relate to an acoustic wave filter including: a bulk acoustic wave device including a first electrode, a second electrode, a piezoelectric layer positioned between the first electrode and second electrode, and at least one temperature compensation layer positioned between the second electrode and the piezoelectric layer, a total thickness of the piezoelectric layer and the at least one temperature compensation layer being sufficiently thick to excite an overtone mode as a main mode of the bulk acoustic wave device; and a plurality of additional acoustic wave resonators, the bulk acoustic wave device and the plurality of additional acoustic wave resonators together configured to filter a radio frequency signal.

In some embodiments, the techniques described herein relate to an acoustic wave filter wherein a thickness of the at least one temperature compensation layer is a multiple of one thirty-second of a wavelength of an acoustic wave propagating in the at least one temperature compensation layer, and a thickness of the piezoelectric layer is greater than the thickness of the at least one temperature compensation layer.

In some embodiments, the techniques described herein relate to an acoustic wave filter wherein the thickness of the piezoelectric layer is a multiple of one sixteenth of a wavelength of an acoustic wave propagating through the piezoelectric layer, and the thickness of the at least one temperature compensation layer is sufficiently thick to provide a temperature coefficient of frequency variation of less than 1 ppm/° C.

In some embodiments, the techniques described herein relate to an acoustic wave filter wherein the at least one temperature compensation layer is a silicon oxide layer, and the piezoelectric layer is an aluminum nitride layer.

In some embodiments, the techniques described herein relate to an acoustic wave filter wherein the at least one temperature compensation layer is in physical contact with the second electrode and the piezoelectric layer.

In some embodiments, the techniques described herein relate to an acoustic wave filter wherein the at least one temperature compensation layer includes a first temperature compensation layer positioned between the second electrode and the piezoelectric layer and a second temperature compensation layer positioned between the first electrode and the piezoelectric layer.

In some embodiments, the techniques described herein relate to an acoustic wave filter wherein the second temperature compensation layer is in physical contact with the first electrode and the piezoelectric layer.

In some embodiments, the techniques described herein relate to a radio frequency module including: a filter including a bulk acoustic wave device disclosed herein; radio frequency circuitry; and a package structure enclosing the filter and the radio frequency circuitry.

In some embodiments, the techniques described herein relate to a method of radio frequency signal processing, the method including: filtering a radio frequency signal with a filter that includes a bulk acoustic wave device disclosed herein; and transmitting the filtered radio frequency signal via at least one antenna.

In some aspects, the techniques described herein relate to a bulk acoustic wave device configured to excite an overtone mode as a main mode, the bulk acoustic wave device including: a first electrode; a piezoelectric layer positioned over the first electrode; a second electrode positioned such that the piezoelectric layer is located between the first electrode and second electrode; and at least one temperature compensation layer configured to provide temperature compensation for the bulk acoustic wave device, the at least one temperature compensation layer having a thickness that is a multiple of one thirty-second of a wavelength of an acoustic wave propagating through the at least one temperature compensation layer, the bulk acoustic wave device configured to excite the overtone mode as the main mode, the piezoelectric layer being thicker than the at least one temperature compensation layer.

In some embodiments, the techniques described herein relate to a bulk acoustic wave device wherein at least one temperature compensation layer is positioned between the first electrode and the second electrode.

In some embodiments, the techniques described herein relate to a bulk acoustic wave device wherein the thickness of the at least one temperature compensation layer is not a multiple of one sixteenth of the wavelength.

In some embodiments, the techniques described herein relate to a bulk acoustic wave device wherein the at least one temperature compensation layer provides provide temperature compensation for the bulk acoustic wave device such that a temperature coefficient of frequency of the bulk acoustic wave device is in a range of −2 ppm/° C. to −19 ppm/° C.

In some embodiments, the techniques described herein relate to a bulk acoustic wave device wherein the at least one temperature compensation layer provides provide temperature compensation for the bulk acoustic wave device such that the temperature coefficient of frequency of the bulk acoustic wave device is in a range of −10 ppm/° C. to −15 ppm/° C.

In some embodiments, the techniques described herein relate to a bulk acoustic wave device wherein a total thickness of the piezoelectric layer and the at least one temperature compensation layer is sufficiently thick to excite a second overtone mode as the main mode of the bulk acoustic wave device.

In some embodiments, the techniques described herein relate to a bulk acoustic wave device wherein a total thickness of the piezoelectric layer and the at least one temperature compensation layer is sufficiently thick to excite a third overtone mode as the main mode of the bulk acoustic wave device.

In some embodiments, the techniques described herein relate to a bulk acoustic wave device wherein the at least one temperature compensation layer is a silicon oxide layer.

In some embodiments, the techniques described herein relate to a bulk acoustic wave device wherein the piezoelectric layer includes aluminum nitride.

In some embodiments, the techniques described herein relate to a bulk acoustic wave device wherein the piezoelectric layer is a scandium doped aluminum nitride layer.

In some embodiments, the techniques described herein relate to a bulk acoustic wave device wherein the thickness of the at least one temperature compensation layer is sufficiently thick to provide a temperature coefficient of frequency variation of less than 1 ppm/° C.

In some embodiments, the techniques described herein relate to a bulk acoustic wave device wherein a thickness of the piezoelectric layer is a multiple of one sixteenth of a wavelength of an acoustic wave propagating through the piezoelectric layer.

In some embodiments, the techniques described herein relate to a bulk acoustic wave device wherein the at least one temperature compensation layer is in contact with the second electrode and the piezoelectric layer.

In some embodiments, the techniques described herein relate to a bulk acoustic wave device wherein the at least one temperature compensation layer includes a first temperature compensation layer positioned between the second electrode and the piezoelectric layer and a second temperature compensation layer positioned between the first electrode and the piezoelectric layer.

In some embodiments, the techniques described herein relate to a bulk acoustic wave device wherein the second temperature compensation layer is in contact with the first electrode and the piezoelectric layer.

In some embodiments, the techniques described herein relate to a bulk acoustic wave device wherein a resonant frequency of the overtone mode is in a range from 5 gigahertz to 12 gigahertz.

In some aspects, the techniques described herein relate to an acoustic wave filter including: a bulk acoustic wave device including a first electrode, a piezoelectric layer positioned over the first electrode, a second electrode positioned such that the piezoelectric layer is located between the first electrode and second electrode, and at least one temperature compensation layer configured to provide temperature compensation for the bulk acoustic wave device, the at least one temperature compensation layer having a thickness that is a multiple of one thirty-second of a wavelength of an acoustic wave propagating through the at least one temperature compensation layer, the bulk acoustic wave device configured to excite an overtone mode as a main mode; and a plurality of additional acoustic wave resonators, the bulk acoustic wave device and the plurality of additional acoustic wave resonators together configured to filter a radio frequency signal.

In some embodiments, the techniques described herein relate to an acoustic wave filter wherein the at least one temperature compensation layer is positioned between the second electrode and the piezoelectric layer.

In some embodiments, the techniques described herein relate to an acoustic wave filter wherein the thickness of the piezoelectric layer is a multiple of one sixteenth of a wavelength of an acoustic wave propagating through the piezoelectric layer.

In some embodiments, the techniques described herein relate to an acoustic wave filter wherein the at least one temperature compensation layer provides provide temperature compensation for the bulk acoustic wave device such that a temperature coefficient of frequency of the bulk acoustic wave device is in a range of −2 ppm/° C. to −19 ppm/° C.

In some embodiments, the techniques described herein relate to an acoustic wave filter wherein the at least one temperature compensation layer is a silicon oxide layer, and the piezoelectric layer is an aluminum nitride layer.

In some embodiments, the techniques described herein relate to an acoustic wave filter wherein the at least one temperature compensation layer is in contact with the second electrode and the piezoelectric layer.

In some embodiments, the techniques described herein relate to an acoustic wave filter wherein the at least one temperature compensation layer includes a first temperature compensation layer positioned between the second electrode and the piezoelectric layer and a second temperature compensation layer positioned between the first electrode and the piezoelectric layer.

In some embodiments, the techniques described herein relate to an acoustic wave filter wherein the second temperature compensation layer is in contact with the first electrode and the piezoelectric layer.

In some embodiments, the techniques described herein relate to a radio frequency module including: a filter including a bulk acoustic wave device disclosed herein; radio frequency circuitry; and a package structure enclosing the filter and the radio frequency circuitry.

The present disclosure relates to U.S. Patent Application Ser. No. 18/635,933, titled "OVERTONE MODE ACOUSTIC WAVE DEVICE WITH TEMPERATURE COMPENSATION LAYER" filed on Apr. 15, 2024, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 2 is a table that shows various parameters of the BAW device of FIG. 1 and the thin BAW device.

FIGS. 4A-1, 4B-1, and 4C-1 are graphs showing simulation results of resonant frequency values of the BAW device at various thicknesses of a temperature compensation layer.

FIGS. 4A-2, 4B-2, and 4C-2 are graphs showing simulation results of electromechanical coupling coefficient ($kt^2$) values of the BAW device at various thicknesses of the temperature compensation layer.

FIGS. 4A-3, 4B-3, and 4C-3 are graphs showing simulation results of temperature coefficient of frequency (TCF) values of the BAW device at various thicknesses of the temperature compensation layer.

DETAILED DESCRIPTION OF CERTAIN EMBODIMENTS

Figure 1:
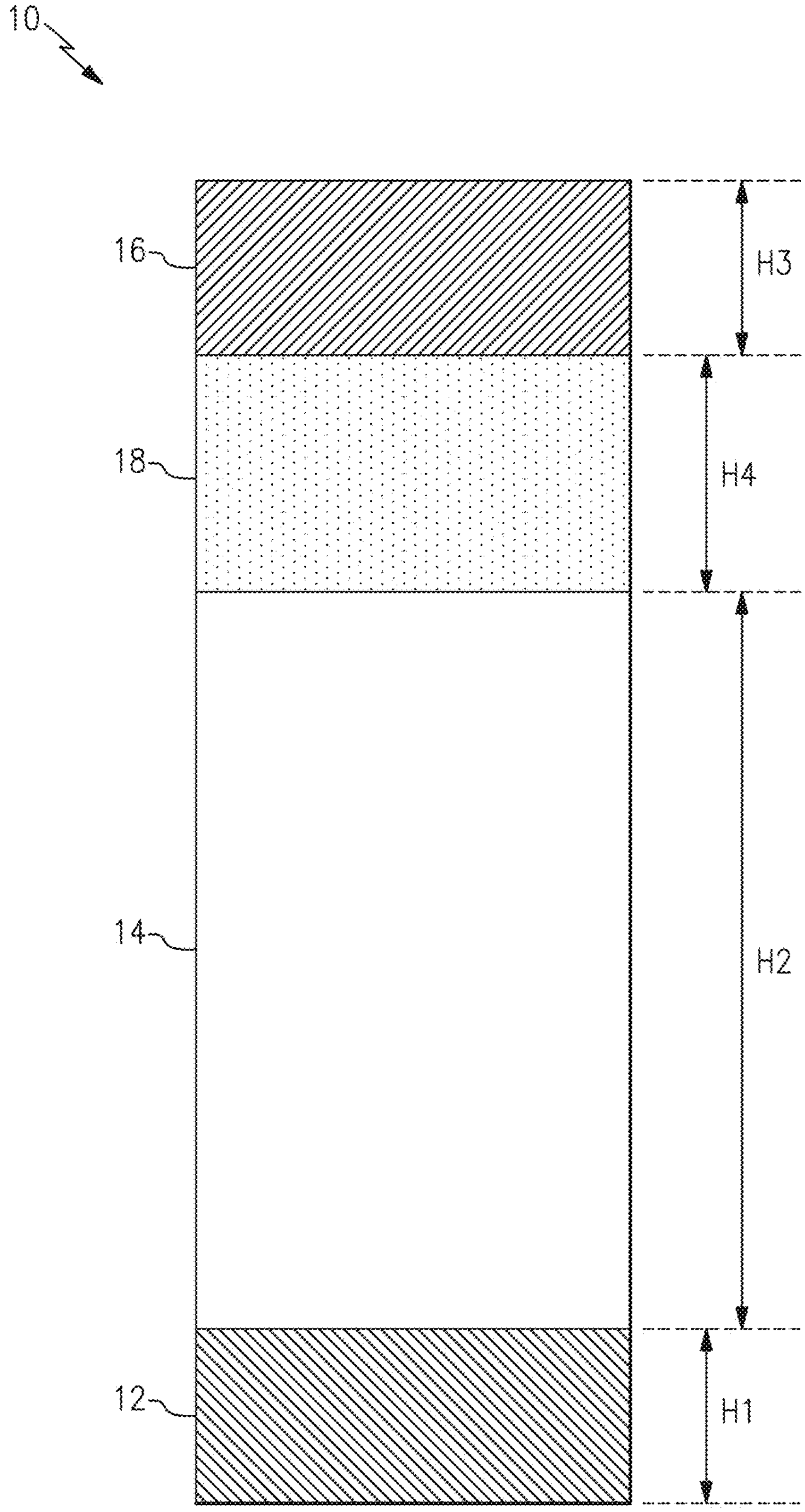
FIG. 1 is a schematic cross-sectional side view of a portion of a bulk acoustic wave (BAW) device according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. Any suitable principles and advantages of the bulk acoustic wave (BAW) devices disclosed herein can be implemented together with each other.

BAW resonators with higher resonant frequencies are desired for filters to filter higher frequency radio frequency (RF) signals, such as ultra-high bands above 5 gigahertz (GHz). BAW resonators often use a fundamental mode as a main mode. When using fundamental mode to achieve higher resonant frequency, the BAW resonator size gets smaller and the piezoelectric layer gets thinner when maintaining the same impedance.

The piezoelectric layer thickness can scale with 1/f and the desired capacitance per branch can also scale with 1/f for achieving the same impedance, where f is resonant frequency. Consequently, the BAW resonator area can scale with $1/f^2$. As one example, reducing resonant frequency by a factor of two (2) can reduce piezoelectric layer thickness by a factor of two (2) and area by a factor of four (4) for achieving the same impedance. BAW resonators with smaller physical size can have a lower quality factor (Q) than larger sized resonators.

The size reduction of a BAW resonator for scaling for higher resonant frequency may help with reducing filter size. However, there are a variety of technical challenges associated with smaller sized BAW resonators with thinner piezoelectric layers, such as one or more of more spurious modes, increased edge energy leakage, reduced power handling capabilities and/or degraded ruggedness, or challenges in manufacturing and/or trimming. During operation of the BAW device, heat can be generated, which can alter the material properties (e.g., stiffness or Young's modulus) of the layers in the BAW device such as the piezoelectric layer in a manner that can negatively affect the performance of the BAW device. Such negative consequences may be more pronounced with a thinner piezoelectric layer.

Smaller BAW resonators and lower Q values can lead to higher density of dissipated power in a BAW device. Power handling at high frequencies is typically more difficult to achieve than at lower frequencies.

Technical challenges can also be present in manufacturing as a result of deposition processes, clean-up processes, and subtractive trimming processes introducing error in absolute thickness. Frequency sensitivity to changes in thickness [MHz/nm] can increase at higher frequencies. Higher frequency devices can involve more advanced trimming or have larger frequency margins for manufacturing.

Aspects of this disclosure relate to a BAW resonator that uses an overtone mode as a main mode instead of a fundamental mode. In various embodiments disclosed herein, a total thickness of a piezoelectric layer and a temperature compensation layer that are disposed between first and second electrodes can contribute to exciting the overtone mode as the main mode. The temperature compensation layer can play an active role in shaping the overtone mode of the BAW device. By exciting the overtone mode, a higher resonant frequency can be achieved than by using the fundamental mode as the main mode. For example, the overtone mode can have a resonant frequency in a range from about 1.5 to about 2.5 times the fundamental mode.

BAW devices disclosed herein with an overtone mode as a main mode can achieve a number of advantages over other BAW devices. BAW devices discussed herein with an overtone mode as the main mode can have fewer spurious modes compared with similar BAW devices with a fundamental mode as the main mode. BAW devices discussed herein with an overtone mode as the main mode can have better power handling compared with similar BAW devices with a fundamental mode as the main mode. The better power handling can be at least partly due to a larger physical size and/or thicker BAW material stacks of BAW resonators with an overtone mode disclosed herein. BAW devices disclosed herein can achieve low electromechanical coupling coefficient $kt^2$ variation. BAW devices discussed herein with an overtone mode as the main mode can have higher yield compared with similar BAW devices with a fundamental mode as the main mode. In fifth generation (5G) New Radio (NR) applications, BAW devices disclosed herein can advantageously be used for filtering higher frequency ranges than used in certain previous applications for BAW devices.

Moreover, BAW devices disclosed herein can also achieve desirable temperature compensation features over certain other BAW devices and/or certain other BAW overtone mode devices. BAW devices disclosed herein can achieve one or more of lower temperature coefficient of frequency (TCF) variation, lower TCF variation percentage, or lower temperature compensation layer thickness variation than certain other BAW devices.

FIG. 1 is a schematic cross-sectional side view of a portion of a bulk acoustic wave (BAW) device 10 according to an embodiment. The BAW device 10 can include a first electrode 12, a piezoelectric layer 14, a second electrode 16, and a temperature compensation layer 18.

The piezoelectric layer 14 is positioned between the first electrode 12 and the second electrode 16, and the temperature compensation layer 18 is positioned between the piezoelectric layer 14 and the second electrode 16. The BAW device 10 can be configured to excite an overtone mode as the main mode of the BAW device 10. In the BAW device 10, the temperature compensation layer 18 is sufficiently thick such that the overtone mode is excited.

The piezoelectric layer 14 can be in physical contact with respective planar surfaces of the first electrode 12 and the temperature compensation layer 18. In some embodiments, the piezoelectric layer 14 can have a crystalline axis or c-axis that is perpendicular to a planar surface of the first electrode 12. Adjusting the c-axis orientation can adjust the resonant frequency of the BAW device 10. The piezoelectric layer 14 can be an aluminum nitride layer. The piezoelectric layer 14 can be a zinc oxide layer. The piezoelectric layer 14 can include any suitable piezoelectric material for a particular application. The piezoelectric layer 14 can be doped with any suitable dopant, such as scandium (Sc), chromium (Cr), magnesium (Mg), or the like. For example, the piezoelectric layer 14 can be a scandium doped aluminum nitride layer. Doping the piezoelectric layer 14 can adjust resonant frequency. Doping the piezoelectric layer 14 can increase the coupling coefficient $k^2$ of the BAW device 10. Doping to increase the coupling coefficient $k^2$ can be advantageous at higher frequencies where the coupling coefficient $k^2$ can be degraded. The BAW device 10 can advantageously achieve low variation in coupling coefficient $k^2$. The piezoelectric layer 14 has a thickness H2. The resonant frequency of the BAW device 10 can depend on the thickness H2 of the piezoelectric layer 14. A thinner piezoelectric layer 14 can have a higher resonant frequency, and a thicker piezoelectric layer 14 can have a lower resonant frequency. The thickness H2 of the piezoelectric layer 14 can be a multiple or a fraction of one eighth of the half value of the wavelength ($\lambda_2/2$) of the acoustic wave propagating through the piezoelectric layer 14. Thus, the thickness H2 can be determined by $H2=n*(\lambda_2/2)$; where n=⅛, ⅜, ⅝ . . . ; and $\lambda_2$ represents the wavelength of the acoustic wave that propagates in the piezoelectric layer 14.

The first electrode 12 can be referred to as a lower electrode and the second electrode 12 can be referred to as an upper electrode. The first electrode 12 can have a relatively high acoustic impedance. The first electrode 12 can include molybdenum (Mo), tungsten (W), ruthenium (Ru), chromium (Cr), iridium (Ir), platinum (Pt), Ir/Pt, or any suitable alloy and/or combination thereof. Similarly, the second electrode 16 can have a relatively high acoustic impedance. The second electrode 16 can include Mo, W, Ru, Cr, Ir, Pt, Ir/Pt, or any suitable alloy and/or combination thereof. The second electrode 16 can be formed of the same material as the first electrode 12 in certain instances. The first electrode 12 has a thickness H1. The second electrode 16 has a thickness H3. The thickness H1 of the first electrode 12 can be approximately the same as the thickness H3 of the second electrode 16 in the BAW device 10. The thickness H1 of the first electrode 12 and the thickness H3 of the second electrode 16 can each be multiples or fractions of one eighth of the half value of the wavelength ($\lambda_1/2$ or $\lambda_3/2$) of the acoustic wave propagating through the first electrode 12 or the second electrode 16. Thus, the thickness H1, H3 can be determined by: H1, $H3=m*(\lambda_1/2$ or $\lambda_3/2)$; where m=⅛, ⅜, ⅝ . . . ; and $\lambda_1$ or $\lambda_3$ represents the wavelengths of the acoustic wave that propagates through the first electrode 12 or the second electrode 16 respectively. In some embodiments, the wavelength a, or a can be the same.

As illustrated, the temperature compensation layer 18 is positioned between the piezoelectric layer 14 and the second electrode 16. In some other applications, a temperature compensation layer can alternatively be positioned between the first electrode 12 and the piezoelectric layer 14 in accordance with any suitable principles and advantages disclosed herein.

The temperature compensation layer 18 can bring the temperature coefficient of frequency (TCF) of the BAW device 10 closer to zero relative to a similar BAW device without the temperature compensation layer 18. The temperature compensation layer 18 can have a positive TCF. This can compensate for the piezoelectric layer 14 having a negative TCF. The temperature compensation layer 18 can be a silicon dioxide ($SiO_2$) layer. The temperature compensation layer 18 can be any other suitable temperature compensation layer, such as aluminum oxide, silicon carbide, aluminum nitride, silicon nitride, silicon oxynitride, or the like. The temperature compensation layer 18 can include a dielectric material. The temperature compensation layer 18 can include any other suitable temperature compensating material including without limitation a tellurium dioxide ($TeO_2$) layer or a silicon oxyfluoride (SiOF layer). The temperature compensation layer 18 can include any suitable combination of $SiO_2$, $TeO_2$, and/or SiOF.

The temperature compensation layer 18 has a thickness H4. The thickness H4 of the temperature compensation layer 18 can be a multiple or a fraction of one eighth or one sixteenth of the half value of the wavelength ($\lambda_4/2$) of the acoustic wave propagating through the temperature compensation layer 18. Thus, the thickness H4 can be determined by: $H4=k*(\lambda_4/2)$; where k=1/16, 2/16, 3/16 . . . ; and $\lambda_4$ represents the wavelength of the acoustic wave that propagates in the temperature compensation layer 18. The thickness H4 of the temperature compensation layer 18 can be greater than the thickness H3 of the second electrode 16 in the BAW device 10. In some embodiments, the thickness H4 of the temperature compensation layer 18 can be more than 3 times the thickness H3 of the second electrode 16 in the BAW device 10. In some embodiments, the thickness H4 of the temperature compensation layer 18 can be in a range from 1.5 to 4 times the thickness H3 of the second electrode 16 in the BAW device 10.

In some embodiments, the thickness H4 of the temperature compensation layer 18 can be less than the thickness H2 of the piezoelectric layer 14 in the BAW device 10. In some embodiments, the thickness H4 of the temperature compensation layer 18 is can be in a range from 0.3 to 1.0 times the thickness H2 in the BAW device 10. A total thickness of the thickness H2 of the piezoelectric layer 14 and the thickness H4 of the temperature compensation layer 18 can be sufficiently thick to excite the overtone mode as the main mode of the BAW device 10.

The thickness H4 of the temperature compensation layer 18 can relate to the TCF of the BAW device 10. The temperature compensation layer 18 with the thickness H4 disclosed herein can excite the overtone mode as the main mode of the BAW device 10, while providing desirable temperature compensation. By adjusting the thickness H4 of the temperature compensation layer 18, the shape of the overtone mode the BAW device 10 operates at can be adjusted. The BAW device 10 can operate in either the second overtone mode or the third overtone mode depending at least in part on the thickness H4 of the temperature compensation layer 18. The BAW device 10 disclosed herein can have an electromechanical coupling coefficient $k^2$ that is higher than that of a similar BAW device that has a thickness equal to half value of the wavelength (½) of the acoustic wave being generated.

The piezoelectric layer 14 and the temperature compensation layer 18 can together define an active area, a capacitive area, or an acoustic wave propagating portion of the BAW device 10. When a total thickness of the thicknesses H2, H4 of the piezoelectric layer 14 and the temperature compensation layer 18 is made twice compared to an original thickness in the BAW device 10, the frequency can be twice as high as the BAW device 10 with the original thickness. This relationship can be represented by: $f=(v/2d)*m$; where f is the resonant frequency in Hertz (Hz); v is the velocity of the acoustic wave in the material of the BAW device 10; d is the total thickness of the piezoelectric layer 14 and the temperature compensation layer 18 in meters (m); and m is the mode order, representing the integer number of the resonant mode of interest in the BAW device 10.

As noted above, in certain BAW devices with the fundamental mode as the main mode, the thickness of the BAW device is reduced to provide a higher frequency. However, there are various disadvantages (e.g., increased edge energy leakage, reduced power handling capabilities, degraded ruggedness, and/or degraded thermal dissipation function) in making the thickness of BAW device relatively thin. Embodiments disclosed herein can enable the BAW device 10 to provide a higher frequency without significantly reducing the thickness of the BAW device 10.

As an example, in order to meet the specification of a band pass filter for band B47/V2X (5.8-5.9 GHz), the BAW device 10 can have a total thickness of about 1200 nm. The total thickness of the BAW device 10 may include one or more passivation layers, one or more seed layers, and/or other layers of the BAW device 10 that are not shown in FIG. 1. In order to meet the same specification of the band filter without implementing the principles and advantages disclosed herein, a thin BAW device that includes a similar structure as the BAW device 10 would have a total thickness of about 600 nm. FIG. 2 is a table that shows various parameters of the BAW device 10 and the thin BAW device calculated based on a temperature compensation layer thickness variation of ±5 nm. FIG. 2 indicates that the BAW device 10 has lower process sensitivity to temperature compensation layer thickness variation than a thin BAW device with a fundamental mode as its main mode.

The table of FIG. 2 shows that the BAW device 10 has a thickness variation of the temperature compensation layer 18 of 1.2% to 5%, a TCF variation of less than 1 ppm/° C. or less than 10% relative to a −10 ppm/° C., and an electromechanical coupling coefficient ($kt^2$) variation in a range from 2.9% to 3.1% (absolute) or less than 0.1% for $kt^2$ of 3% for the temperature compensation thickness variation of ±5 nm. The table of FIG. 2 shows that the thin BAW device has a thickness variation of its temperature compensation layer of 20% to 50%, a TCF variation of ±5 ppm/° C. or 50% relative to a −10 ppm/° C., and a electromechanical coupling coefficient ($kt^2$) variation in a range from 1.09% to 4.44% (absolute) or 40% to 60% for $kt^2$ of 3% for the temperature compensation thickness variation of ±5 nm. The table of FIG. 2 also indicates that the temperature compensation layer 18 of the BAW device 10 is actively used to incrementally shape the overtone mode, while the temperature compensation layer of the thin BAW device is passively used (not being used to actively shape the mode).

Figure 3B:
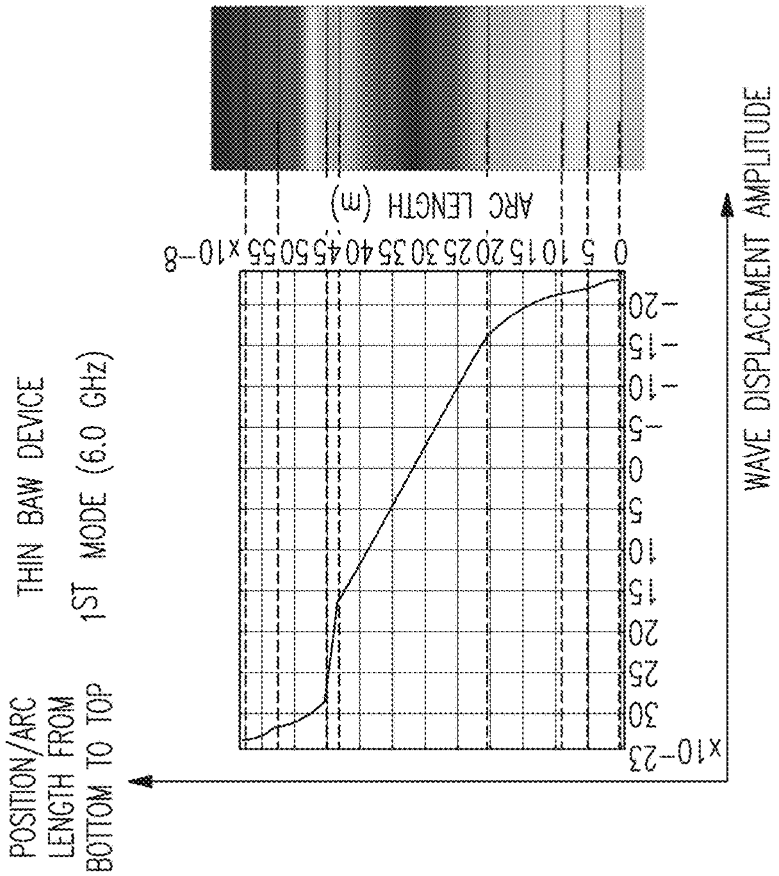
FIG. 3B is a graph showing a wave displacement amplitude on an x-axis and a vertical position of the thin BAW device used in FIG. 2 in a y-axis.
Figure 3A:
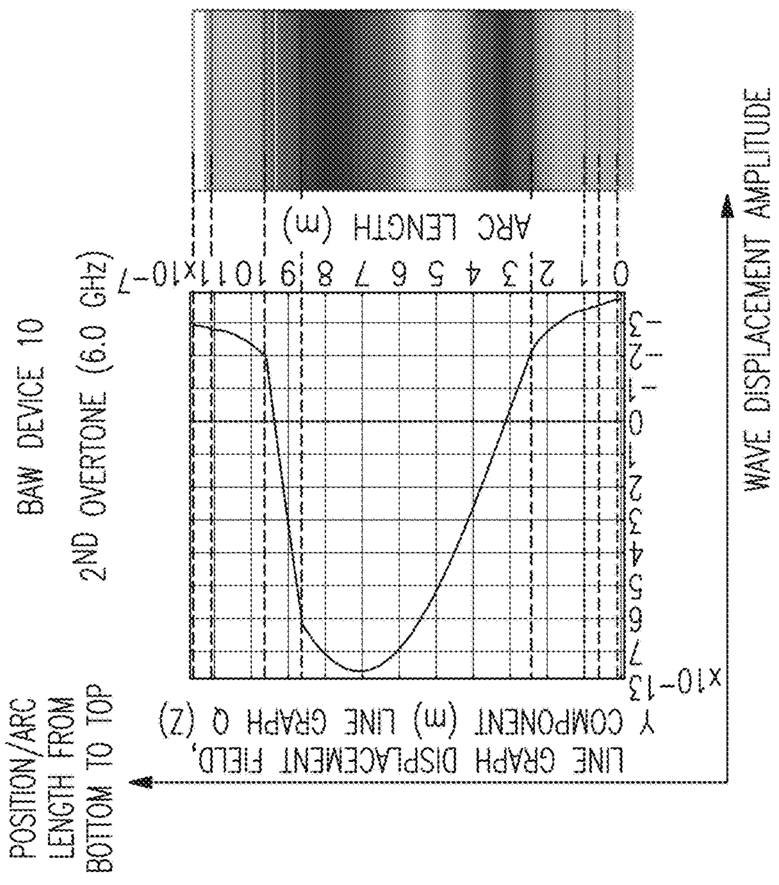
FIG. 3A is a graph showing a wave displacement amplitude on an x-axis and a vertical position of the BAW device of FIG. 1 used in FIG. 2 in a y-axis.

FIG. 3A is a graph showing a wave displacement amplitude on an x-axis and a vertical position of the BAW device 10 used in FIG. 2 in a y-axis. FIG. 3B is a graph showing a wave displacement amplitude on an x-axis and a vertical position of the thin BAW device used in FIG. 2 in a y-axis. As shown in FIGS. 3A and 3B, the BAW device 10 operates at a second overtone mode as the main mode, and the thin BAW device operates at a first mode as the main mode. The graph of FIG. 3A indicates that the heat generated in the BAW device 10 is more effectively dissipated through the temperature compensation layer 18 as compared to the thin BAW device.

One example method of optimizing the thickness H4 of the temperature compensation layer 18 will be described. Optimization of the thickness H4 of the temperature compensation layer 18 for providing the BAW device 10 with target frequency, coupling coefficient $kt^2$, and/or TCF can depend on various factors, such as the material of the piezoelectric layer 14, or the thicknesses H1, H2, H3 of the first electrode 12, the piezoelectric layer 14, and the second electrode 16. In some embodiments, a stack model without the temperature compensation layer 18 for the BAW device 10 can be built with an initial stack thickness of $\lambda/2$ of respective layers of the BAW device 10. The frequency, the $kt^2$, and/or the TCF can be calculated and/or simulated for the stack model. The temperature compensation layer 18 having the thickness H4 of $\lambda_4/2$ can be added to the stack model to define an initial model of the BAW device 10. The target frequency, $kt^2$, and/or TCF can be calculated and/or simulated for the initial model of the BAW device 10. The thickness H2 of the piezoelectric layer 14 can be adjusted in increments of eighths (m/8) of the $\lambda_2/2$ to control the resonant frequency and/or the $kt^2$. The thickness H4 of the temperature compensation layer 18 can be adjusted in increments of sixteenths (m/16) of the $\lambda_2/2$ thickness to control or tune the TCF, the resonance frequency and/or the $kt^2$ to meet the target values. The thicknesses H1-H4 of the first electrode 12, the piezoelectric layer 14, the second electrode 16, and the temperature compensation layer 18 can be adjusted to fine-tune the resonant frequency, the $kt^2$, and/or the TCF.

Design examples of the BAW device 10 that meet the specification of a passband filter for band B47/V2X (5.8-5.9 GHz) using a scandium doped aluminum nitride layer ($Sc_{20}Al_{80}N$) as the piezoelectric layer 14 will be described with reference to graphs shown in FIGS. 4A-6C. The examples of the BAW devices 10 implement molybdenum (Mo) layers as the first and second electrodes 12, 16 and a silicon dioxide ($SiO_2$) layer as the temperature compensation layer 18.

Figures 1, 4A:
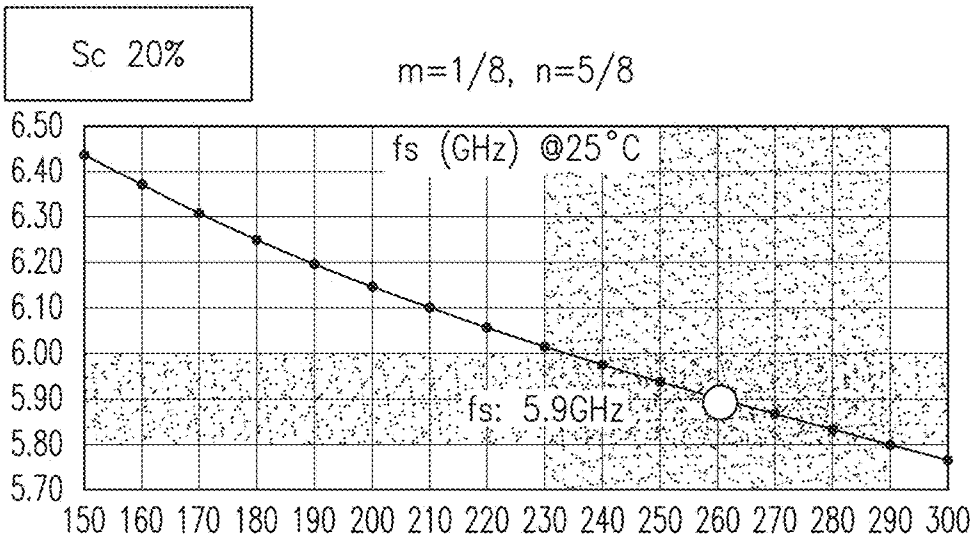
Figures 2, 4A:
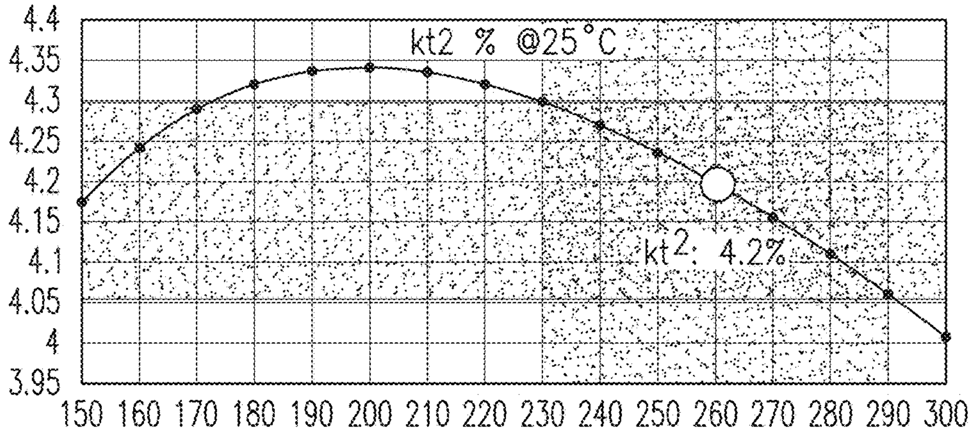
Figures 3, 4A:
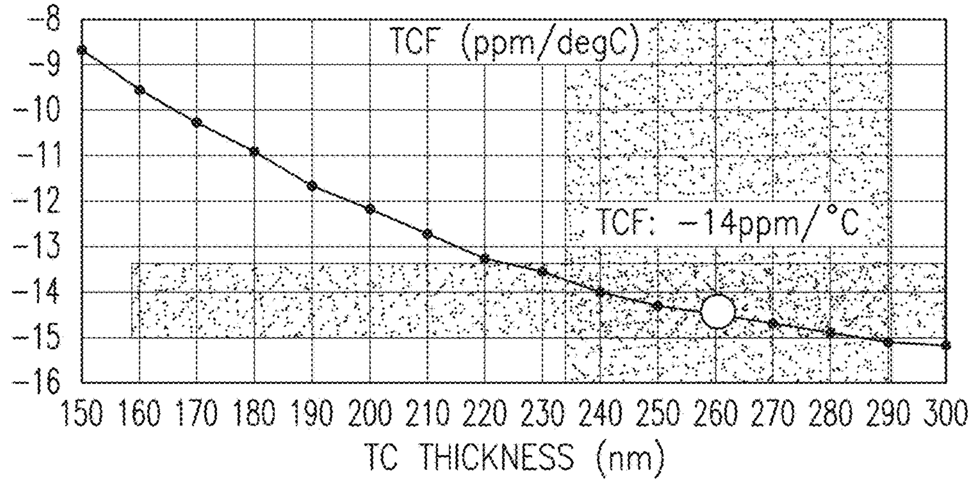

FIG. 4A-1 is a graph showing a simulation result of resonant frequency values at various thicknesses H4 of the temperature compensation layer 18. FIG. 4A-2 is a graph showing a simulation result of electromechanical coupling coefficient ($kt^2$) values at various thicknesses H4 of the temperature compensation layer 18. FIG. 4A-3 is a graph showing a simulation result of temperature coefficient of frequency (TCF) values at various thicknesses H4 of the temperature compensation layer 18.

In the simulation of FIGS. 4A-1 to 4A-3, the thickness H1 of the first electrode 12 is set to 72.5 nm ($1/8*\lambda_1/2$), the thickness H2 of the piezoelectric layer 14 is set to 625 nm ($5/8*\lambda_2/2$), and the thickness H3 of the second electrode 16 is set to 72.5 nm ($1/8*\lambda_3/2$). The results of FIGS. 4A-1 to 4A-3 indicate that the thickness H4 of the temperature compensation layer 18 being about 260 nm ($8/16*\lambda_4/2$) can provide an optimal performance for the particular example.

Figures 1, 4B:
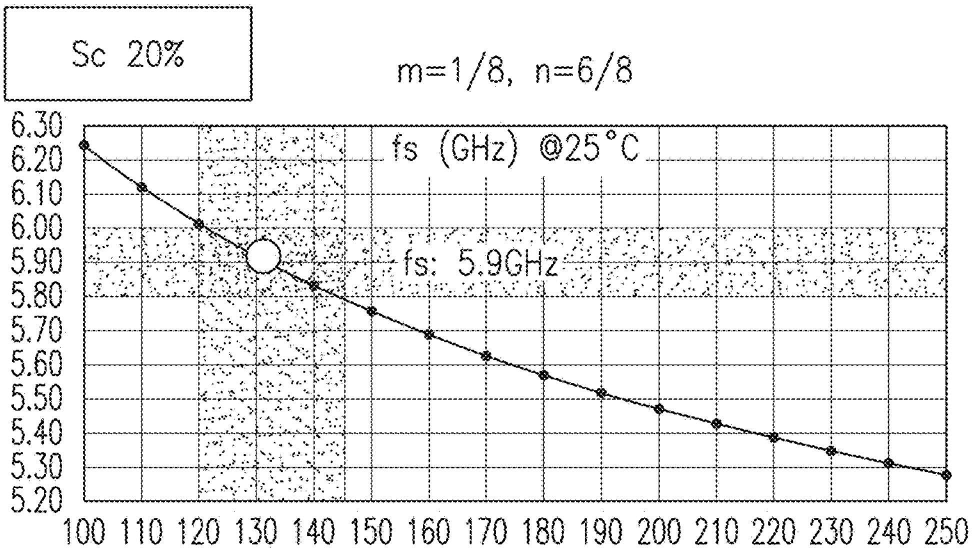
Figures 2, 4B:
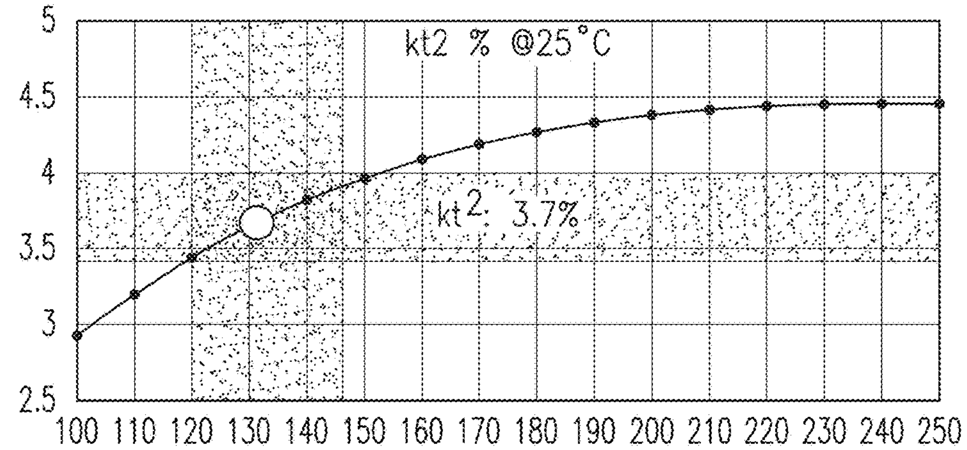
Figures 3, 4B:
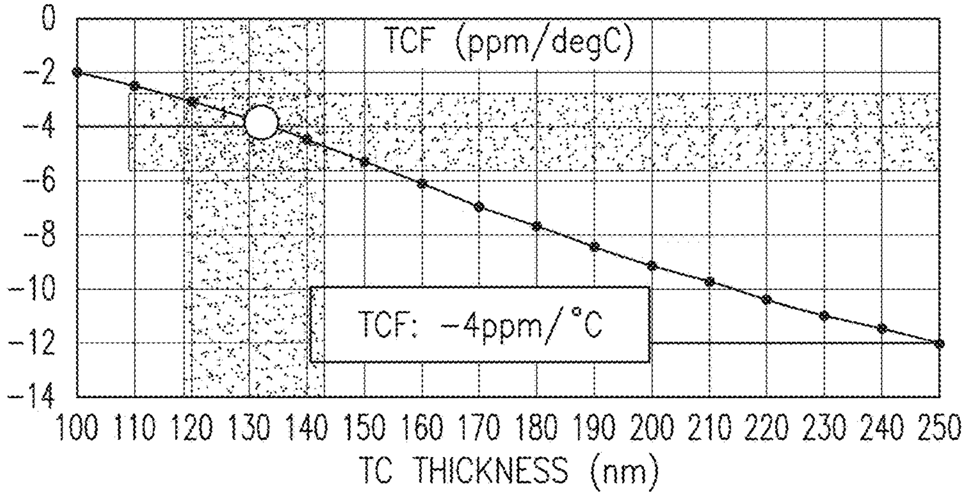

FIG. 4B-1 is a graph showing a simulation result of resonant frequency values at various thicknesses H4 of the temperature compensation layer 18. FIG. 4B-2 is a graph showing a simulation result of electromechanical coupling coefficient ($kt^2$) values at various thicknesses H4 of the temperature compensation layer 18. FIG. 4B-3 is a graph showing a simulation result of temperature coefficient of frequency (TCF) values at various thicknesses H4 of the temperature compensation layer 18.

In the simulation of FIGS. 4B-1 to 4B-3, the thickness H1 of the first electrode 12 is set to 72.5 nm ($1/8*\lambda/2$), the thickness H2 of the piezoelectric layer 14 is set to 750 nm ($6/8*\lambda/2$), and the thickness H3 of the second electrode 16 is set to 72.5 nm ($1/8*\lambda/2$). The results of FIGS. 4B-1 to 4B-3 indicate that the thickness H4 of the temperature compensation layer 18 being about 130 nm ($2/16*\lambda/2$) can provide an optimal performance for the particular example.

Figures 1, 4C:
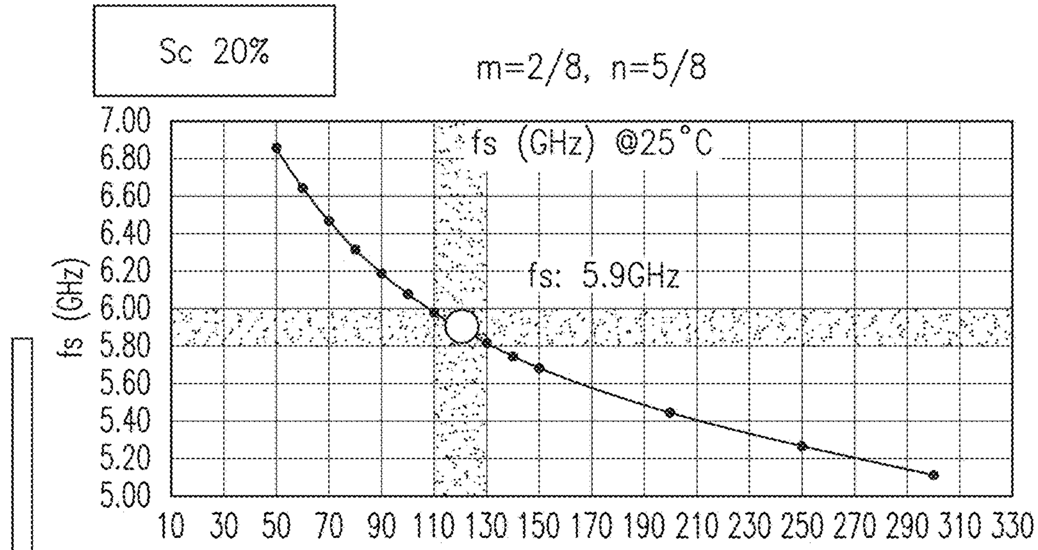
Figures 2, 4C:
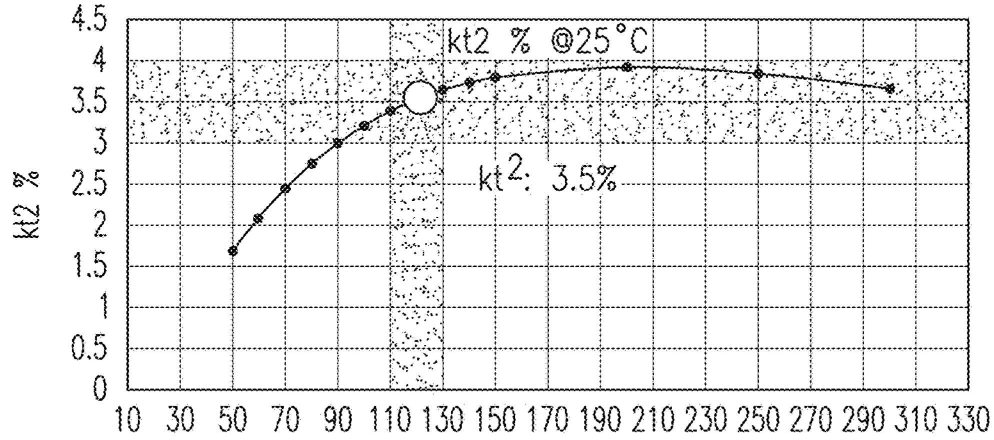
Figures 3, 4C:
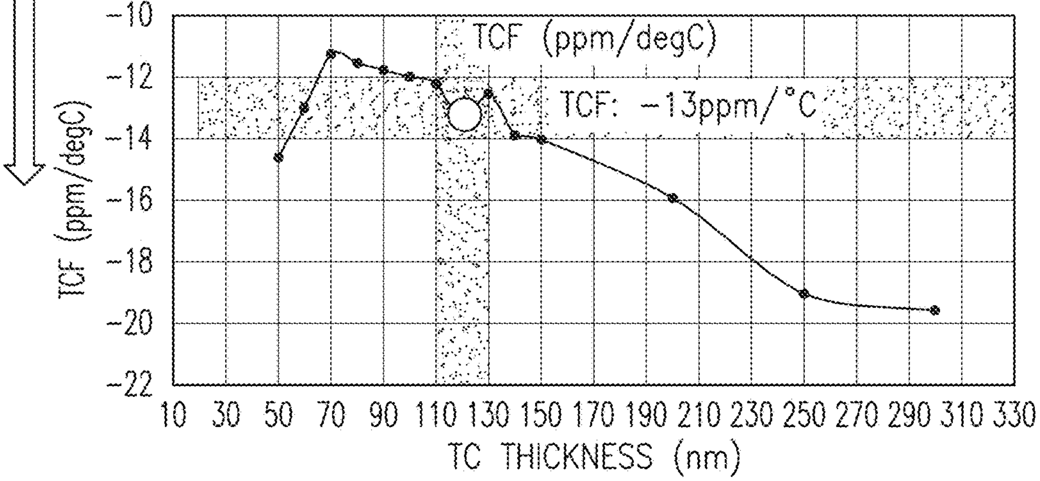

FIG. 4C-1 is a graph showing a simulation result of resonant frequency values at various thicknesses H4 of the temperature compensation layer 18. FIG. 4C-2 is a graph showing a simulation result of electromechanical coupling coefficient ($kt^2$) values at various thicknesses H4 of the temperature compensation layer 18. FIG. 4C-3 is a graph showing a simulation result of temperature coefficient of frequency (TCF) values at various thicknesses H4 of the temperature compensation layer 18.

In the simulation of FIGS. 4C-1 to 4C-3, the thickness H1 of the first electrode 12 is set to 72.5 nm (⅛*λ/2), the thickness H2 of the piezoelectric layer 14 is set to 750 nm (⅝*λ/2), and the thickness H3 of the second electrode 16 is set to 72.5 nm (⅛*λ/2). The results of FIGS. 4C-1 to 4C-3 indicate that the thickness H4 of the temperature compensation layer 18 being about 130 nm (2/16*λ/2) can provide an optimal performance for the particular example.

The scandium doped aluminum nitride layer ($Sc_{20}Al_{80}N$) is used as the piezoelectric layer 14 in the simulations of FIGS. 4A-1 to 4C-3 as an example. The thickness H2 of the piezoelectric layer 14 can depend at least in part by the material of the piezoelectric layer 14. For example, when the material that has a lower acoustic wave traveling velocity is used as the piezoelectric layer 14, the thickness H2 may be thinner. For example, when the scandium concentration is higher, the thickness H2 may be thinner.

In some embodiments, the thickness H4 of the temperature compensation layer 18 can be selected to have the temperature coefficient of frequency (TCF) of the BAW device 10 in a range of −2 ppm/° C. to −19 ppm/° C. For example, the thickness H4 of the temperature compensation layer 18 can selected to have the TCF of the BAW device 10 in a range of −3 ppm/° C. to −5 ppm/° C., −8 ppm/° C. to −15 ppm/° C., −10 ppm/° C. to −15 ppm/° C., −8 ppm/° C. to −10 ppm/° C., or −4 ppm/° C. to −8 ppm/° C.

In some embodiments, additional temperature compensation layer(s) or passivation layer(s) can be provided to the BAW device 10. Such additional temperature compensation layer(s) can further improve the temperature coefficient of frequency (TCF) of the BAW device 10. A passivation layer can be a silicon dioxide layer. The passivation layer can be any other suitable passivation layer, such as aluminum oxide, silicon carbide, aluminum nitride, silicon nitride, silicon oxynitride, or the like. The passivation layer can include a dielectric material.

Figure 5A:
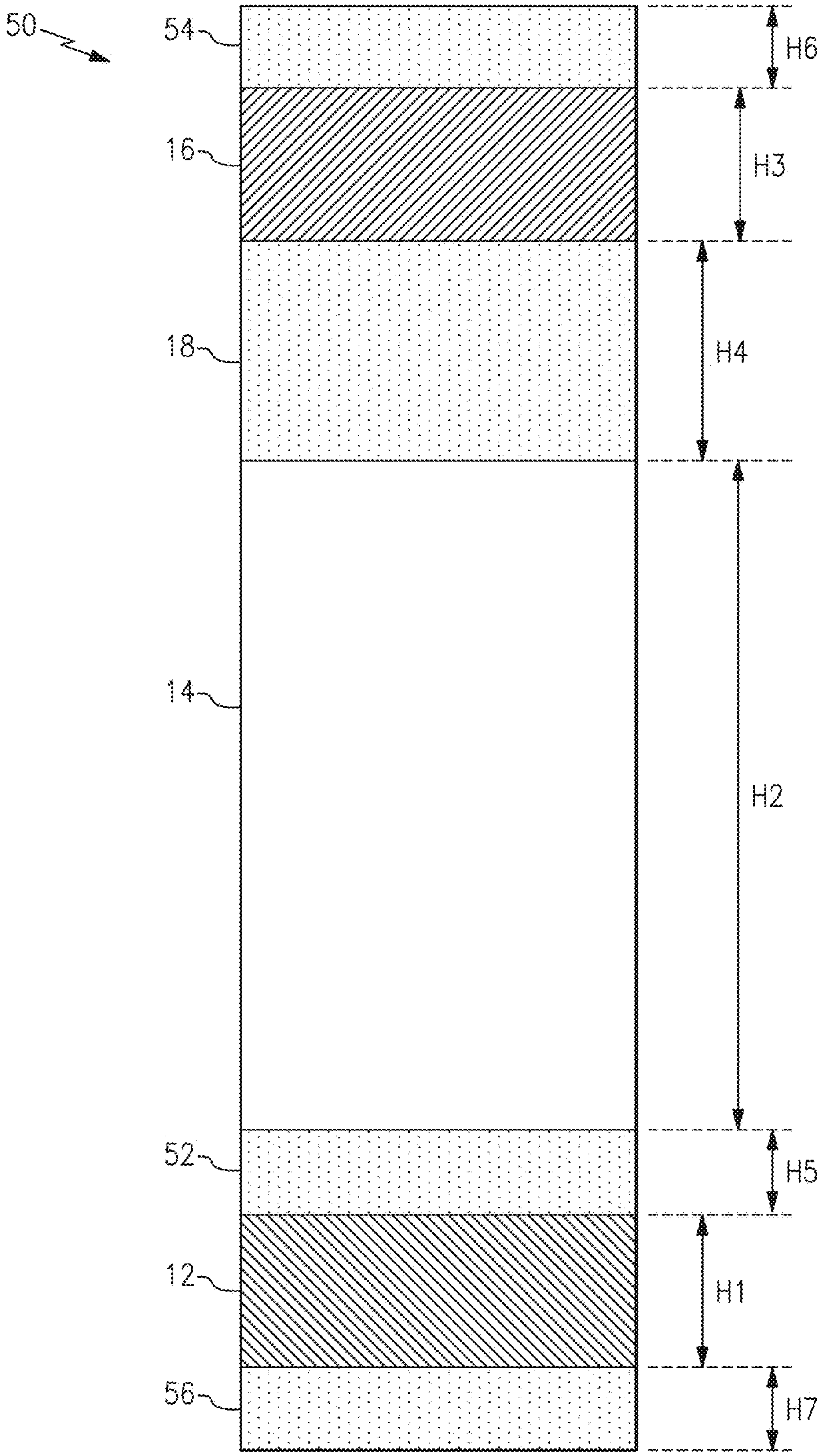
FIG. 5A is a schematic cross-sectional side view of a portion of a bulk acoustic wave (BAW) device according to an embodiment.

FIG. 5A is a schematic cross-sectional side view of a portion of a bulk acoustic wave (BAW) device 50 according to an embodiment. Unless otherwise noted, components of FIG. 5A can be the same as or generally similar to like components of FIG. 1. The BAW device 50 can include a first electrode 12, a piezoelectric layer 14, a second electrode 16, a first temperature compensation layer 18 disposed between the piezoelectric layer 14 and the second electrode 16, a second temperature compensation layer 52 disposed between the piezoelectric layer 14 and the first electrode 12, a first passivation layer 54 over the second electrode 16, and a second passivation layer 56 below the first electrode 12.

Each of the first electrode 12, the piezoelectric layer 14, the second electrode 16, the first temperature compensation layer 18, the second temperature compensation layer 52, the first passivation layer 54 has a respective thickness H1, H2, H3, H4, H5, H6, H7. The thicknesses H1-H7 of the layers of the BAW device 50 can be selected in a similar manner as that described herein with respect to the BAW device 10. A total thickness of the thickness H2 of the piezoelectric layer 14, the thickness H4 of the first temperature compensation layer 18, and the thickness H5 of the second temperature compensation layer 52 can contribute to excite the overtone mode. For example, the total thickness of the thickness H2 of the piezoelectric layer 14, the thickness H4 of the first temperature compensation layer 18, and the thickness H5 of the second temperature compensation layer 52 can be sufficiently thick such that the main mode is a second overtone mode or a third overtone mode.

Figure 5B:
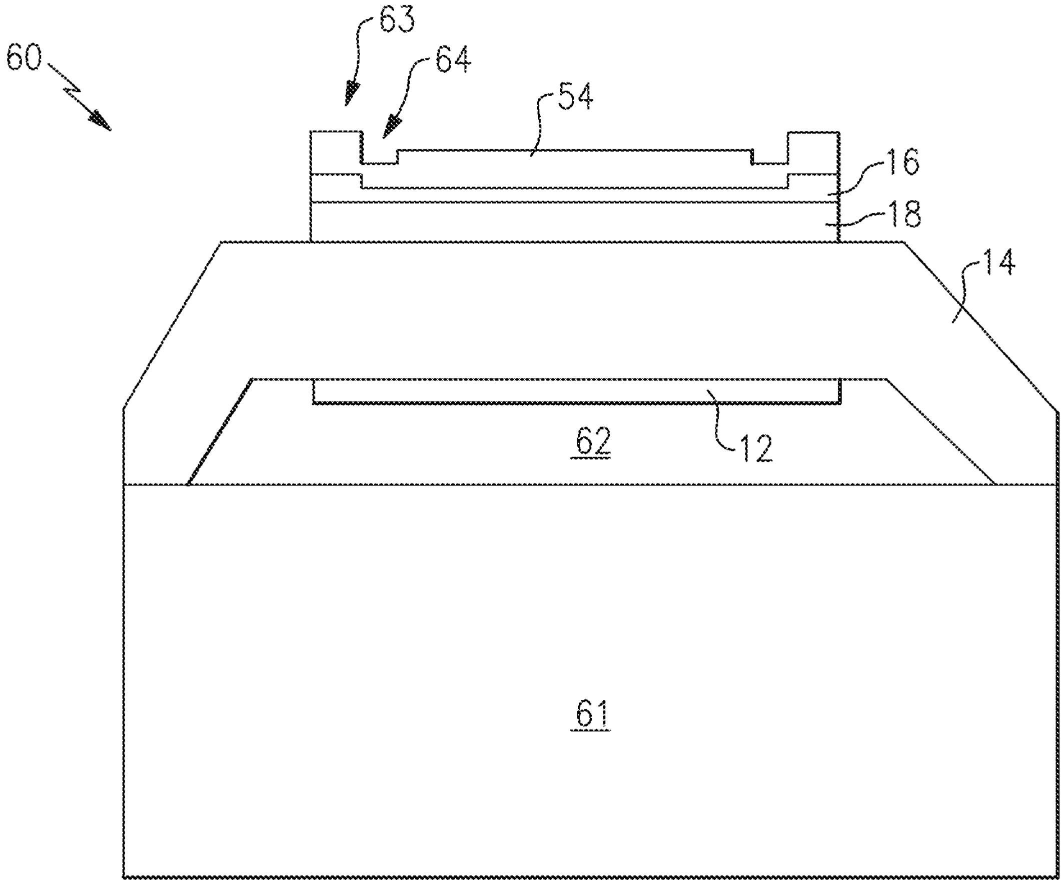
FIG. 5B is a schematic cross-sectional side view of a film bulk acoustic wave resonator (FBAR) according to an embodiment.

FIG. 5B is a schematic cross-sectional side view of an FBAR 60 according to an embodiment. The FBAR 60 includes a support substrate 61, an air cavity 62, and a BAW material stack over the air cavity 62. The BAW material stack includes the first electrode 12, the piezoelectric layer 14, the second electrode 16, the temperature compensation layer 18, and the passivation layer 54. FIG. 5B illustrates an example of the BAW device being an FBAR. The BAW device 60 includes the BAW material stack of the BAW device 10 in a central part of the active region over an acoustic reflector.

In the FBAR 60, the air cavity 62 is an acoustic reflector. As illustrated, the air cavity 62 is located above the support substrate 61. The air cavity 62 is positioned between the support substrate 61 and the first electrode 12. In some applications, an air cavity can be etched into a support substrate. The support substrate 61 can be a silicon substrate. The support substrate 61 can be any other suitable support substrate.

An active region or active domain of the FBAR 60 can be defined by a portion of a piezoelectric layer 14 that is in contact with both the first electrode 12 and the second electrode 16 and overlaps the air cavity 62. Such an active region corresponds to where voltage is applied on opposing sides of the piezoelectric layer 14 over the air cavity 62. The active region can be the acoustically active region of the FBAR 60. The FBAR 60 can also include a raised frame structure 63 and/or a recessed frame region 64. A main acoustically active region can be the central part of the active region that is free from any frame structures, such as a raised frame and/or a recessed frame. There can be a significant (e.g., exponential) fall off of acoustic energy in the piezoelectric layer for a main mode in the frame region relative to the main acoustically active region. The FBAR 60 can excite an overtone mode as the main mode in the main acoustically active region of the FBAR 60.

Figure 5C:
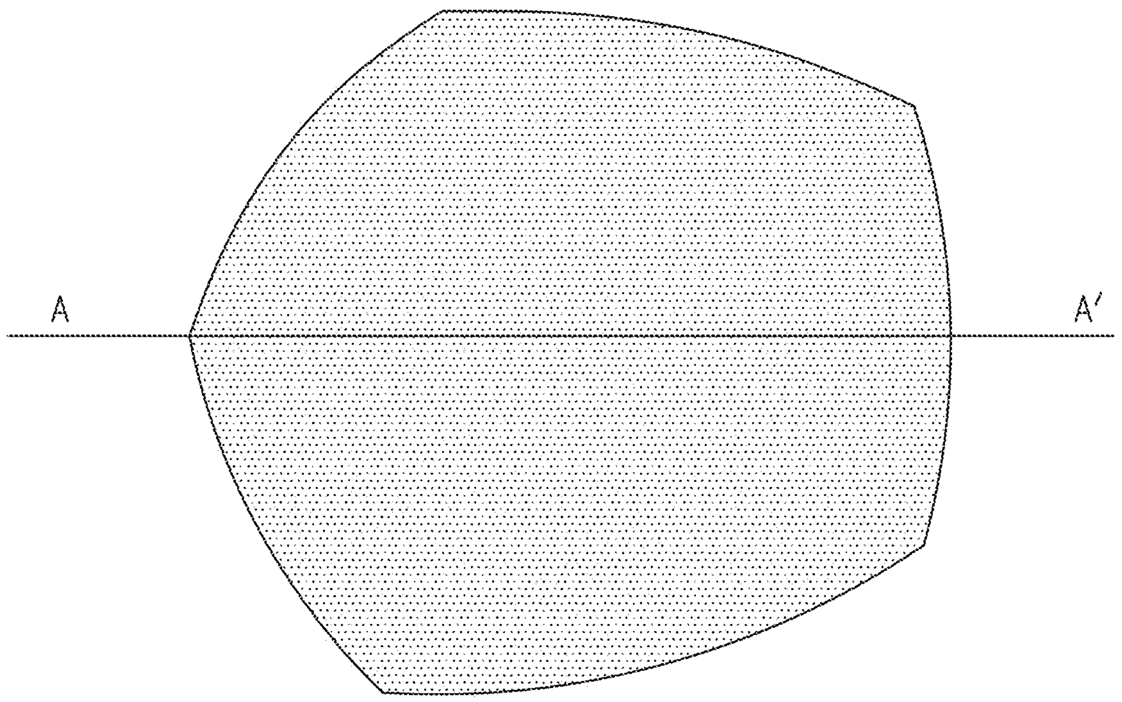
FIG. 5C is a schematic top plan view of a BAW resonator.

FIG. 5C is a schematic plan view of the FBAR 60 of FIG. 5B in an example. Any other BAW devices disclosed herein can be implemented with the same or a similar shape to the FBAR 60 in plan view. The cross-sectional view of FIG. 5B is along the line from A to A' in FIG. 5C. FIG. 5C illustrates the FBAR 60 with a pentagon shape with curved sides in plan view. A BAW device in accordance with any suitable principles and advantages disclosed herein can have any other suitable shape in plan view, such as a quadrilateral shape, a quadrilateral shape with curved sides, a semi-circular shape, a circular shape, or ellipsoid shape.

BAW devices in accordance with any suitable principles and advantages disclosed herein can be implemented in a variety of applications. For example, BAW devices disclosed herein can be implemented as BAW resonators for filters. As another example, BAW devices disclosed herein can be used for an oscillator.

Bulk acoustic wave devices disclosed herein can be implemented as bulk acoustic wave resonators in a variety of filters. Such filters can be arranged to filter a radio frequency signal. Bulk acoustic wave devices disclosed herein can be implemented in a variety of different filter topologies. Example filter topologies include without limitation, ladder filters, lattice filters, hybrid ladder lattice filters, notch filters where a notch is created by a BAW resonator, hybrid acoustic and non-acoustic inductor-capacitor filters, and the like. Some such filters can be band pass filters. In some other applications, such filters include band stop filters. In some instances, bulk acoustic wave devices disclosed herein can be implemented in filters with one or more other types of resonators and/or with passive impedance elements, such as one or more inductors and/or one or more capacitors. Some example filter topologies will now be discussed with reference to FIGS. 6 to 8. Any suitable combination of features of the filter topologies of FIGS. 6 to 8 can be implemented together with each other and/or with other filter topologies.

Figure 6:
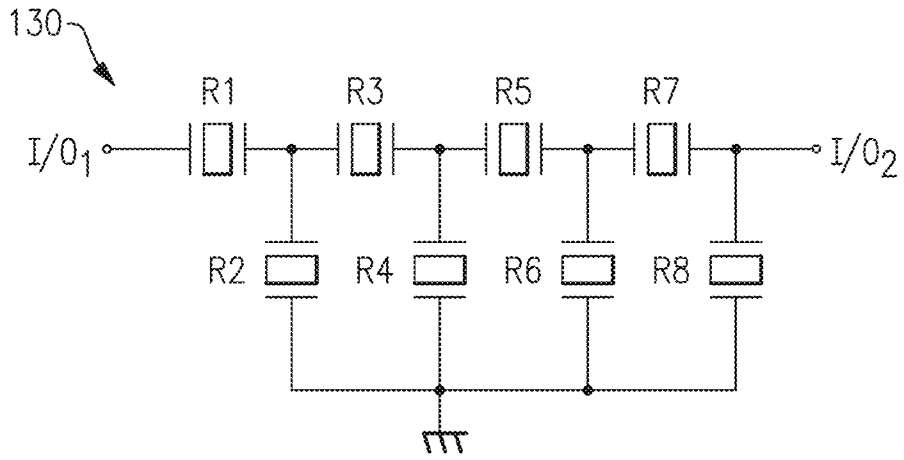
FIG. 6 is a schematic diagram of a ladder filter that includes a bulk acoustic wave resonator according to an embodiment.

FIG. 6 is a schematic diagram of a ladder filter 130 that includes a bulk acoustic wave resonator according to an embodiment. The ladder filter 130 is an example topology that can implement a band pass filter formed from acoustic wave resonators. In a band pass filter with a ladder filter topology, the shunt resonators can have lower resonant frequencies than the series resonators. The ladder filter 130 can be arranged to filter a radio frequency signal. As illustrated, the ladder filter 130 includes series acoustic wave resonators R1 R3, R5, and R7 and shunt acoustic wave resonators R2, R4, R6, and R8 coupled between a first input/output port $I/O_1$ and a second input/output port $I/O_2$. Any suitable number of series acoustic wave resonators can be in included in a ladder filter. Any suitable number of shunt acoustic wave resonators can be included in a ladder filter. The first input/output port $I/O_1$ can a transmit port and the second input/output port $I/O_2$ can be an antenna port. Alternatively, first input/output port $I/O_1$ can be a receive port and the second input/output port $I/O_2$ can be an antenna port.

One or more of the acoustic wave resonators of the ladder filter 130 can include a bulk acoustic wave filter according to an embodiment. For example, the acoustic wave resonators R1 to R8 can each be BAW resonators with an overtone mode as the main mode. In this example, the ladder filter 130 can filter higher frequency signals than with similar BAW resonators with fundamental mode as the main mode.

Figure 7:
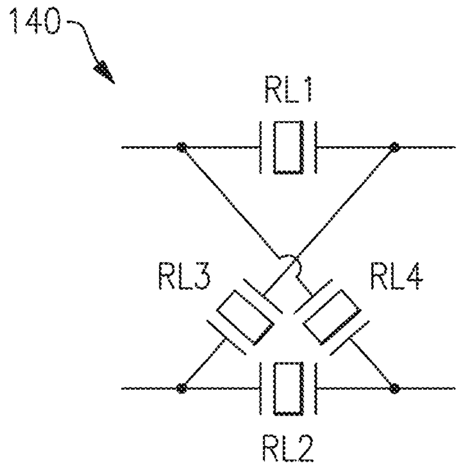
FIG. 7 is a schematic diagram of a lattice filter that includes a bulk acoustic wave resonator according to an embodiment.

FIG. 7 is a schematic diagram of a lattice filter 140 that includes a bulk acoustic wave resonator according to an embodiment. The lattice filter 140 is an example topology that can form a band pass filter from acoustic wave resonators. The lattice filter 140 can be arranged to filter an RF signal. As illustrated, the lattice filter 140 includes acoustic wave resonators RL1, RL2, RL3, and RL4. The acoustic wave resonators RL1 and RL2 are series resonators. The acoustic wave resonators RL3 and RL4 are shunt resonators. The illustrated lattice filter 140 has a balanced input and a balanced output. One or more of the illustrated acoustic wave resonators RL1 to RL4 can be a bulk acoustic wave resonator in accordance with any suitable principles and advantages disclosed herein.

Figure 8:
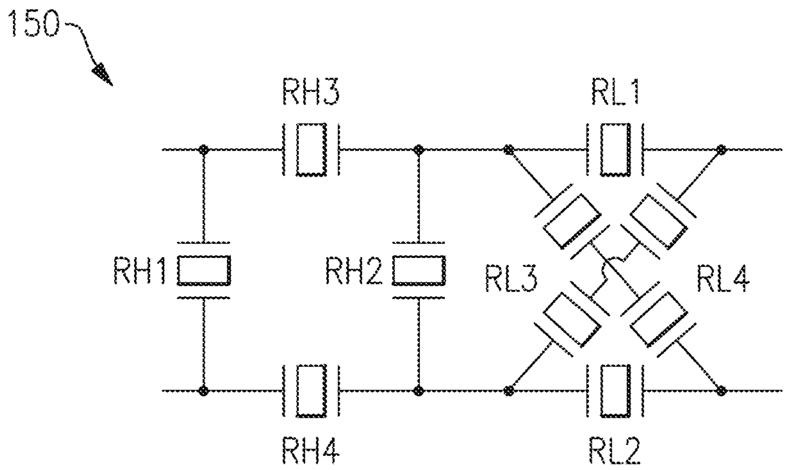
FIG. 8 is a schematic diagram of a hybrid ladder lattice filter that includes a bulk acoustic wave resonator according to an embodiment.

FIG. 8 is a schematic diagram of a hybrid ladder and lattice filter 150 that includes a bulk acoustic wave resonator according to an embodiment. The illustrated hybrid ladder and lattice filter 150 includes series acoustic resonators RL1, RL2, RH3, and RH4 and shunt acoustic resonators RL3, RL4, RH1, and RH2. The hybrid ladder and lattice filter 150 includes one or more bulk acoustic wave resonators in accordance with any suitable principles and advantages disclosed herein.

According to certain applications, a bulk acoustic wave resonator can be included in filter that also includes one or more inductors and one or more capacitors.

One or more bulk acoustic wave resonators including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more BAW resonators disclosed herein. FR1 can be from 410 megahertz (MHz) to 7.125 gigahertz (GHz), for example, as specified in a current 5G NR specification. One or more bulk acoustic wave resonators in accordance with any suitable principles and advantages disclosed herein can be included in an acoustic wave filter for high frequency bands, such as frequency bands in a frequency range from 5 GHz to 10 GHz, from 5 GHz to 20 GHz, or from 5 GHz to 30 GHz. A filter with a bulk acoustic wave resonator disclosed herein can be used for a 5G NR band within FR1 with a relatively high frequency. The relatively high frequency can be at least 5 GHz. One or more bulk acoustic wave resonators in accordance with any suitable principles and advantages disclosed herein can be included in a filter arranged to filter a radio frequency signal in a fourth generation (4G) Long Term Evolution (LTE) operating band. One or more acoustic wave resonators in accordance with any suitable principles and advantages disclosed herein can be included in a filter having a passband that includes a 4G LTE operating band and a 5G NR operating band. Such a filter can be implemented in a dual connectivity application, such as an E-UTRAN New Radio-Dual Connectivity (ENDC) application.

The bulk acoustic wave resonators disclosed herein can be implemented in a standalone filter and/or in a filter in any suitable multiplexer. Such filters can be any suitable topology, such as any filter topology of FIGS. 6 to 8. The filter can be a band pass filter arranged to filter any suitable frequency band, such as a 5G NR band and/or a 4G LTE band. Examples of a standalone filter and multiplexers will be discussed with reference to FIGS. 9A to 9E. Any suitable principles and advantages of these filters and/or multiplexers can be implemented together with each other.

Figure 9A:
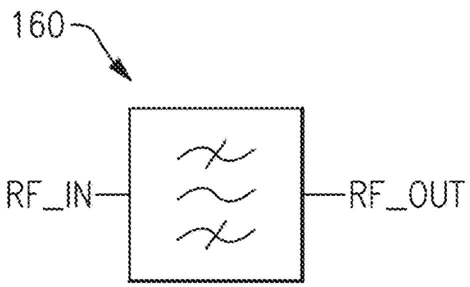
FIG. 9A is a schematic diagram of an acoustic wave filter.

FIG. 9A is schematic diagram of an acoustic wave filter 160. The acoustic wave filter 160 is a band pass filter. The acoustic wave filter 160 is arranged to filter a radio frequency signal. The acoustic wave filter 160 includes one or more acoustic wave devices coupled between a first input/output port RF_IN and a second input/output port RF_OUT. The acoustic wave filter 160 includes a bulk acoustic wave resonator according to an embodiment.

Figure 9B:
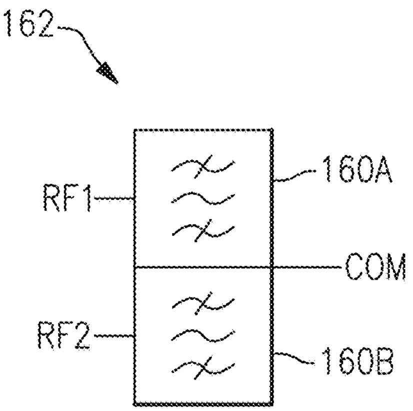
FIG. 9B is a schematic diagram of a duplexer.

FIG. 9B is a schematic diagram of a duplexer 162 that includes an acoustic wave filter according to an embodiment. The duplexer 162 includes a first filter 160A and a second filter 160B coupled to together at a common node COM. One of the filters of the duplexer 162 can be a transmit filter and the other of the filters of the duplexer 162 can be a receive filter. In some other instances, such as in a diversity receive application, the duplexer 162 can include two receive filters. Alternatively, the duplexer 162 can include two transmit filters. The common node COM can be an antenna node.

The first filter 160A is an acoustic wave filter arranged to filter a radio frequency signal. The first filter 160A includes one or more acoustic wave resonators coupled between a first radio frequency node RF1 and the common node COM. The first radio frequency node RF1 can be a transmit node or a receive node. The first filter 160A includes a bulk acoustic wave resonator in accordance with any suitable principles and advantages disclosed herein.

The second filter 160B can be any suitable filter arranged to filter a second radio frequency signal. The second filter 160B can be, for example, an acoustic wave filter, an acoustic wave filter that includes a bulk acoustic wave resonator with an overtone mode as a main mode, an LC filter, a hybrid acoustic wave LC filter, or the like. The second filter 160B is coupled between a second radio frequency node RF2 and the common node. The second radio frequency node RF2 can be a transmit node or a receive node.

Although example embodiments may be discussed with filters or duplexers for illustrative purposes, any suitable principles and advantages disclosed herein can be implement in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different passbands. Multiplexers can include any suitable number of transmit filters and any suitable number of receive filters. For example, a multiplexer can include all receive filters, all transmit filters, or one or more transmit filters and one or more receive filters. One or more filters of a multiplexer can include any suitable number of bulk acoustic wave devices in accordance with any suitable principles and advantages disclosed herein.

Figure 9C:
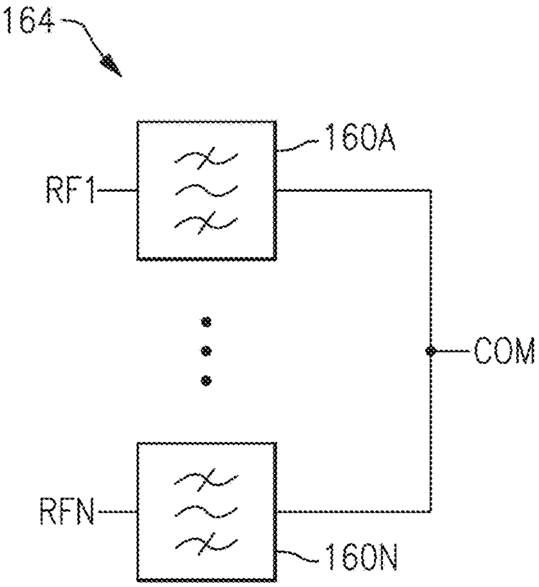
FIG. 9C is a schematic diagram of a multiplexer with hard multiplexing.

FIG. 9C is a schematic diagram of a multiplexer 164 that includes an acoustic wave filter according to an embodiment. The multiplexer 164 includes a plurality of filters 160A to 160N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. As illustrated, the filters 160A to 160N each have a fixed electrical connection to the common node COM. This can be referred to as hard multiplexing or fixed multiplexing. Filters have fixed electrical connections to the common node in hard multiplexing applications.

The first filter 160A is an acoustic wave filter arranged to filter a radio frequency signal. The first filter 160A can include one or more acoustic wave devices coupled between a first radio frequency node RF1 and the common node COM. The first radio frequency node RF1 can be a transmit node or a receive node. The first filter 160A includes a bulk acoustic wave resonator in accordance with any suitable principles and advantages disclosed herein. The other filter (s) of the multiplexer 164 can include one or more acoustic wave filters, one or more acoustic wave filters that include a bulk acoustic wave resonator in accordance with any suitable principles and advantages disclosed herein, one or more LC filters, one or more hybrid acoustic wave LC filters, the like, or any suitable combination thereof.

Figure 9D:
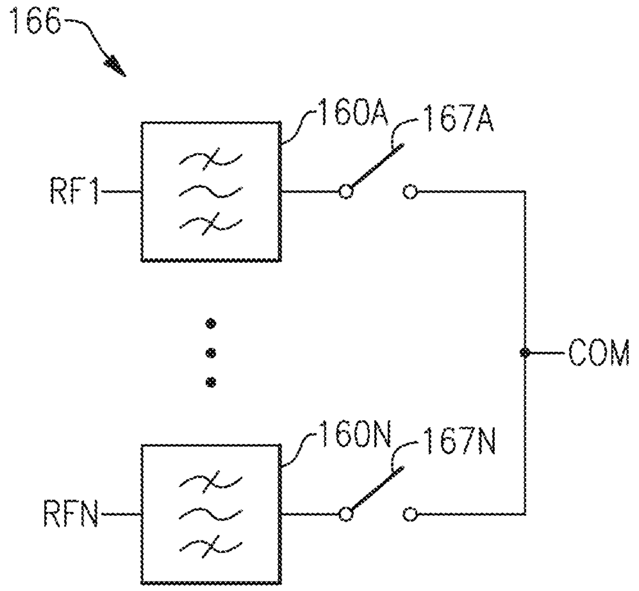
FIG. 9D is a schematic diagram of a multiplexer with switched multiplexing.

FIG. 9D is a schematic diagram of a multiplexer 166 that includes an acoustic wave filter according to an embodiment. The multiplexer 166 is like the multiplexer 164 of FIG. 9C, except that the multiplexer 166 implements switched multiplexing. In switched multiplexing, a filter is coupled to a common node via a switch. In the multiplexer 166, the switches 167A to 167N can selectively electrically connect respective filters 160A to 160N to the common node COM. For example, the switch 167A can selectively electrically connect the first filter 160A the common node COM via the switch 167A. Any suitable number of the switches 167A to 167N can electrically a respective filters 160A to 160N to the common node COM in a given state. Similarly, any suitable number of the switches 167A to 167N can electrically isolate a respective filter 160A to 160N to the common node COM in a given state. The functionality of the switches 167A to 167N can support various carrier aggregations.

Figure 9E:
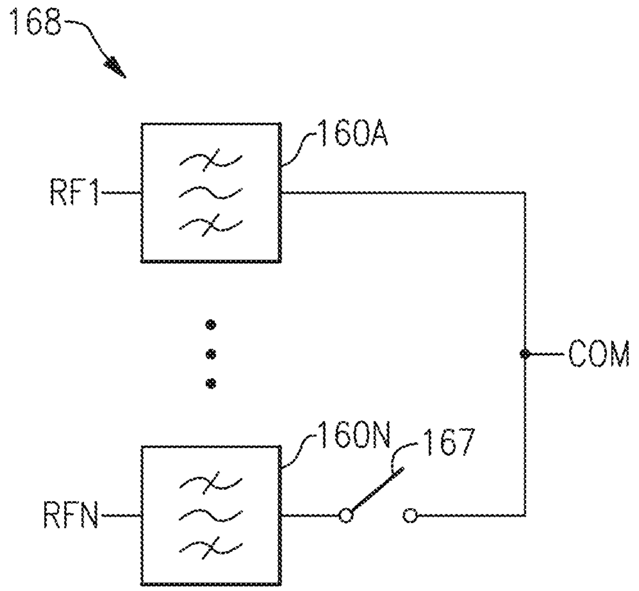
FIG. 9E is a schematic diagram of a multiplexer with a combination of hard multiplexing and switched multiplexing.

FIG. 9E is a schematic diagram of a multiplexer 168 that includes an acoustic wave filter according to an embodiment. The multiplexer 168 illustrates that a multiplexer can include any suitable combination of hard multiplexed and switched multiplexed filters. One or more bulk acoustic wave devices in accordance with any suitable principles and advantages disclosed herein can be included in a filter that is hard multiplexed to the common node of a multiplexer. Alternatively or additionally, one or more bulk acoustic wave devices in accordance with any suitable principles and advantages disclosed herein can be included in a filter that is switch multiplexed to the common node of a multiplexer.

The acoustic wave devices disclosed herein can be implemented in a variety of packaged modules. Some example packaged modules will now be disclosed in which any suitable principles and advantages of the acoustic wave devices, acoustic wave filters, or multiplexers disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 10 to 14 are schematic block diagrams of illustrative packaged modules according to certain embodiments. Any suitable combination of features of these packaged modules can be implemented with each other. While duplexers are illustrated in the example packaged modules of FIGS. 11, 12, and 14, any other suitable multiplexer that includes a plurality of filters coupled to a common node and/or standalone filter can be implemented instead of one or more duplexers. For example, a quadplexer can be implemented in certain applications. As another example, one or more filters of a packaged module can be arranged as a transmit filter or a receive filter that is not included in a multiplexer.

Figure 10:
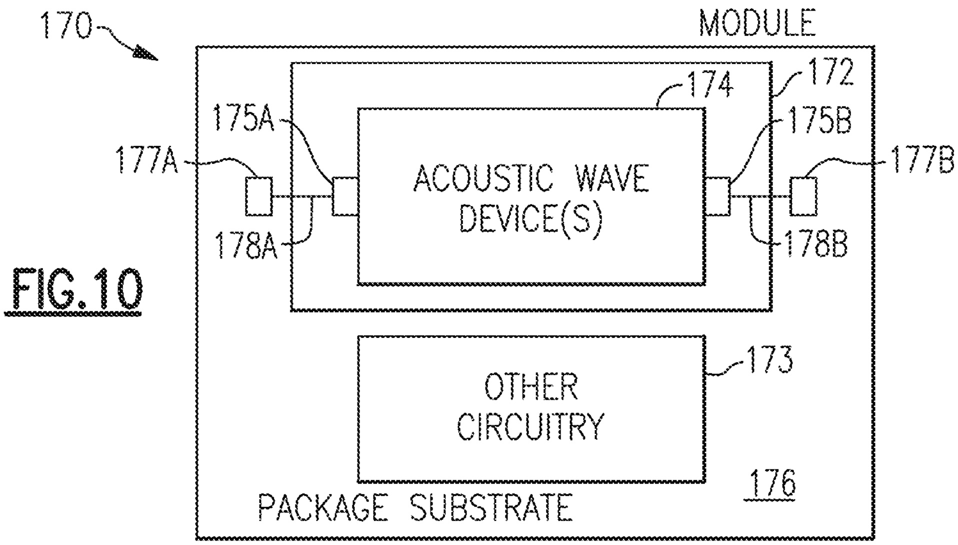
FIG. 10 is a schematic diagram of a radio frequency module that includes an acoustic wave filter according to an embodiment.

FIG. 10 is a schematic diagram of a radio frequency module 170 that includes an acoustic wave component 172 according to an embodiment. The illustrated radio frequency module 170 includes the acoustic wave component 172 and other circuitry 173. The acoustic wave component 172 can include one or more bulk acoustic wave devices in accordance with any suitable combination of features of the bulk acoustic wave devices disclosed herein. The acoustic wave component 172 can include an acoustic wave filter that includes a plurality of bulk acoustic wave resonators, for example.

The acoustic wave component 172 shown in FIG. 10 includes one or more acoustic wave devices 174 and terminals 175A and 175B. The one or more acoustic wave devices 174 include at least one bulk acoustic wave device implemented in accordance with any suitable principles and advantages disclosed herein. The terminals 175A and 174B can serve, for example, as an input contact and an output contact. Although two terminals are illustrated, any suitable number of terminals can be implemented for a particular application. The acoustic wave component 172 and the other circuitry 173 are on a common packaging substrate 176 in FIG. 10. The package substrate 176 can be a laminate substrate. The terminals 175A and 175B can be electrically connected to contacts 177A and 177B, respectively, on the packaging substrate 176 by way of electrical connectors 178A and 178B, respectively. The electrical connectors 178A and 178B can be bumps or wire bonds, for example.

The other circuitry 173 can include any suitable additional circuitry. For example, the other circuitry can include one or more radio frequency amplifiers (e.g., one or more power amplifiers and/or one or more low noise amplifiers), one or more radio frequency switches, one or more additional filters, one or more RF couplers, one or more delay lines, one or more phase shifters, the like, or any suitable combination thereof. The other circuitry 173 can be electrically connected to the one or more acoustic wave devices 174. The radio frequency module 170 can include one or more packaging structures to, for example, provide protection and/or facilitate easier handling of the radio frequency module 170. Such a packaging structure can include an overmold structure formed over the packaging substrate 176. The overmold structure can encapsulate some or all of the components of the radio frequency module 170.

Figure 11:
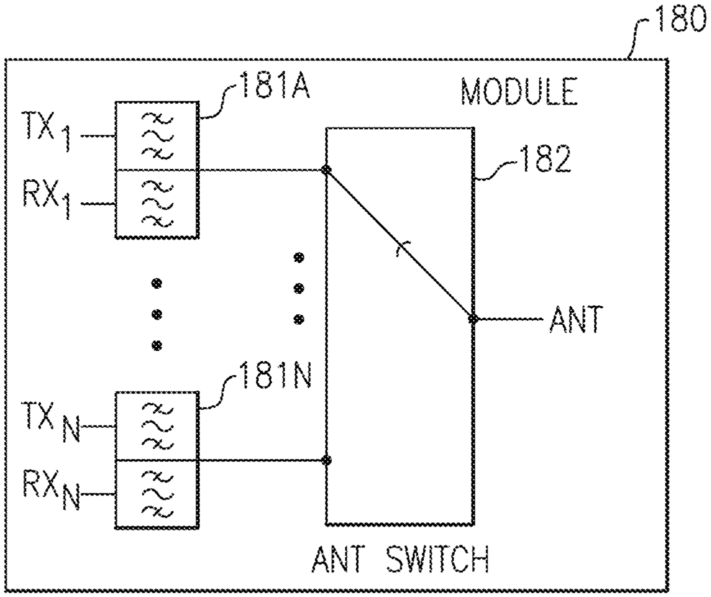
FIG. 11 is a schematic block diagram of a module that includes an antenna switch and duplexers according to an embodiment.

FIG. 11 is a schematic block diagram of a module 180 that includes duplexers 181A to 181N and an antenna switch 182. One or more filters of the duplexers 181A to 181N can include a bulk acoustic wave device in accordance with any suitable principles and advantages disclosed herein. Any suitable number of duplexers 181A to 181N can be implemented. The antenna switch 182 can have a number of throws corresponding to the number of duplexers 181A to 181N. The antenna switch 182 can include one or more additional throws coupled to one or more filters external to the module 180 and/or coupled to other circuitry. The antenna switch 182 can electrically couple a selected duplexer to an antenna port of the module 180.

Figure 12:
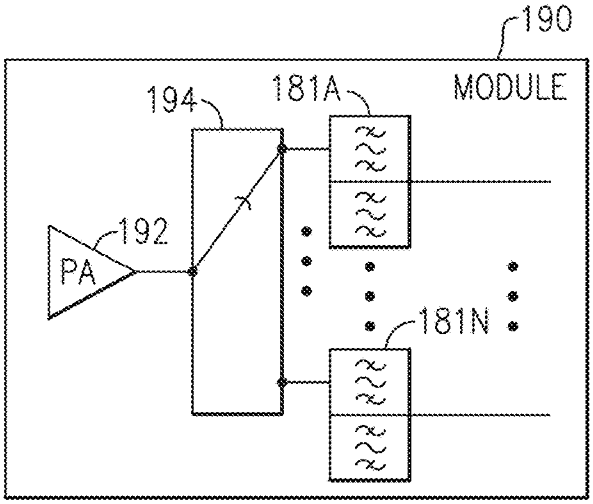
FIG. 12 is a schematic block diagram of a module that includes a power amplifier, a radio frequency switch, and duplexers according to an embodiment.

FIG. 12 is a schematic block diagram of a module 190 that includes a power amplifier 192, a radio frequency switch 194, and duplexers 181A to 181N according to an embodiment. The power amplifier 192 can amplify a radio frequency signal. The radio frequency switch 194 can be a multi-throw radio frequency switch. The radio frequency switch 194 can electrically couple an output of the power amplifier 192 to a selected transmit filter of the duplexers 181A to 181N. One or more filters of the duplexers 181A to 181N can include a bulk acoustic wave device in accordance with any suitable principles and advantages disclosed herein. Any suitable number of duplexers 181A to 181N can be implemented.

Figure 13:
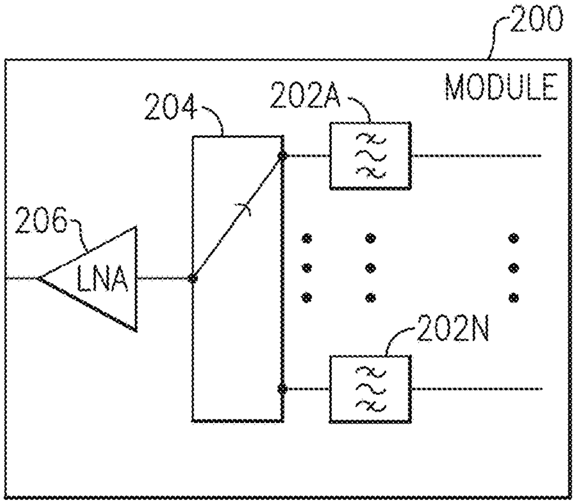
FIG. 13 is a schematic block diagram of a module that includes a low noise amplifier, a radio frequency switch, and filters according to an embodiment.

FIG. 13 is a schematic block diagram of a module 200 that includes filters 202A to 202N, a radio frequency switch 204, and a low noise amplifier 206 according to an embodiment. One or more filters of the filters 202A to 202N can include any suitable number of bulk acoustic wave devices in accordance with any suitable principles and advantages disclosed herein. Any suitable number of filters 202A to 202N can be implemented. The illustrated filters 202A to 202N are receive filters. One or more of the filters 202A to 202N can be included in a multiplexer that also includes a transmit filter and/or another receive filter. The radio frequency switch 204 can be a multi-throw radio frequency switch. The radio frequency switch 204 can electrically couple an output of a selected filter of filters 202A to 202N to the low noise amplifier 206. In some embodiments, a plurality of low noise amplifiers can be implemented. The module 200 can include diversity receive features in certain applications.

Figure 14:
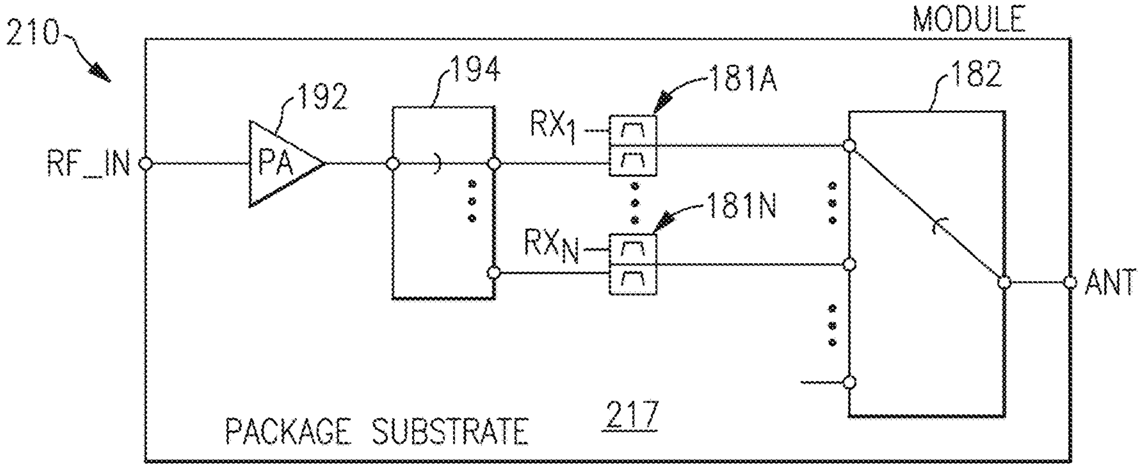
FIG. 14 is a schematic diagram of a radio frequency module that includes an acoustic wave filter according to an embodiment.

FIG. 14 is a schematic diagram of a radio frequency module 210 that includes an acoustic wave filter according to an embodiment. As illustrated, the radio frequency module 210 includes duplexers 181A to 181N, a power amplifier 192, a select switch 194, and an antenna switch 182. The radio frequency module 210 can include a package that encloses the illustrated elements. The illustrated elements can be disposed on a common packaging substrate 217. The packaging substrate 217 can be a laminate substrate, for example. A radio frequency module that includes a power amplifier can be referred to as a power amplifier module. A radio frequency module can include a subset of the elements illustrated in FIG. 14 and/or additional elements. The radio frequency module 210 may include any one of the acoustic wave filters that include at least one bulk acoustic wave resonator in accordance with any suitable principles and advantages disclosed herein.

The duplexers 181A to 181N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters can include a bulk acoustic wave device in accordance with any suitable principles and advantages disclosed herein. Similarly, one or more of the receive filters can include a bulk acoustic wave device in accordance with any suitable principles and advantages disclosed herein. Although FIG. 14 illustrates duplexers, any suitable principles and advantages disclosed herein can be implemented in other multiplexers (e.g., quadplexers, hexaplexers, octoplexers, etc.) and/or in multiplexers with switched multiplexing and/or with standalone filters.

The power amplifier 192 can amplify a radio frequency signal. The illustrated switch 194 is a multi-throw radio frequency switch. The switch 194 can electrically couple an output of the power amplifier 192 to a selected transmit filter of the transmit filters of the duplexers 181A to 181N. In some instances, the switch 194 can electrically connect the output of the power amplifier 192 to more than one of the transmit filters. The antenna switch 182 can selectively couple a signal from one or more of the duplexers 181A to 181N to an antenna port ANT. The duplexers 181A to 181N can be associated with different frequency bands and/or different modes of operation (e.g., different power modes, different signaling modes, etc.).

Figure 15:
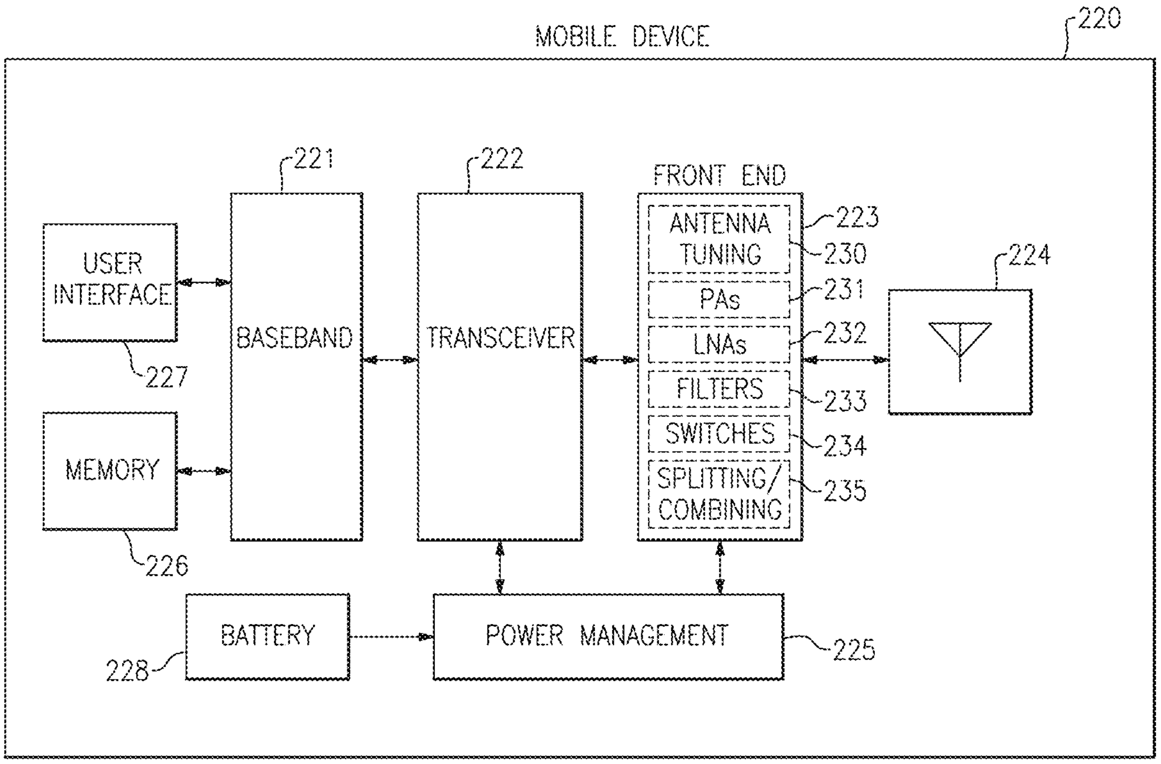
FIG. 15 is a schematic block diagram of a wireless communication device that includes a filter according to an embodiment.

The bulk acoustic wave devices disclosed herein can be implemented in wireless communication devices. FIG. 15 is a schematic block diagram of a wireless communication device 220 that includes a filter according to an embodiment. The wireless communication device 220 can be a mobile device. The wireless communication device 220 can be any suitable wireless communication device. For instance, a wireless communication device 220 can be a mobile phone, such as a smart phone. As illustrated, the wireless communication device 220 includes a baseband system 221, a transceiver 222, a front end system 223, one or more antennas 224, a power management system 225, a memory 226, a user interface 227, and a battery 228.

The wireless communication device 220 can be used communicate using a wide variety of communications technologies, including, but not limited to, 2G, 3G, 4G (including LTE, LTE-Advanced, and/or LTE-Advanced Pro), 5G NR, WLAN (for instance, Wi-Fi), WPAN (for instance, Bluetooth and/or ZigBee), WMAN (for instance, WiMax), and/or GPS technologies.

The transceiver 222 generates RF signals for transmission and processes incoming RF signals received from the antennas 224. Various functionalities associated with the transmission and receiving of RF signals can be achieved by one or more components that are collectively represented in FIG. 15 as the transceiver 222. In one example, separate components (for instance, separate circuits or dies) can be provided for handling certain types of RF signals.

The front end system 223 aids in conditioning signals provided to and/or received from the antennas 224. In the illustrated embodiment, the front end system 223 includes antenna tuning circuitry 230, power amplifiers (PAs) 231, low noise amplifiers (LNAs) 232, filters 233, switches 234, and signal splitting/combining circuitry 235. However, other implementations are possible. The filters 233 can include one or more acoustic wave filters that include any suitable number of bulk acoustic wave devices in accordance with any suitable principles and advantages disclosed herein.

For example, the front end system 223 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 220 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 224 can include antennas used for a wide variety of types of communications. For example, the antennas 224 can include antennas for transmitting and/or receiving signals associated with a wide variety of frequencies and communications standards.

In certain implementations, the antennas 224 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 220 can operate with beamforming in certain implementations. For example, the front end system 223 can include amplifiers having controllable gain and phase shifters having controllable phase to provide beam formation and directivity for transmission and/or reception of signals using the antennas 224. For example, in the context of signal transmission, the amplitude and phases of the transmit signals provided to the antennas 224 are controlled such that radiated signals from the antennas 224 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 224 from a particular direction. In certain implementations, the antennas 224 include one or more arrays of antenna elements to enhance beamforming.

The baseband system 221 is coupled to the user interface 227 to facilitate processing of various user input and output (I/O), such as voice and data. The baseband system 221 provides the transceiver 222 with digital representations of transmit signals, which the transceiver 222 processes to generate RF signals for transmission. The baseband system 221 also processes digital representations of received signals provided by the transceiver 222. As shown in FIG. 15, the baseband system 221 is coupled to the memory 226 of facilitate operation of the wireless communication device 220.

The memory 226 can be used for a wide variety of purposes, such as storing data and/or instructions to facilitate the operation of the wireless communication device 220 and/or to provide storage of user information.

The power management system 225 provides a number of power management functions of the wireless communication device 220. In certain implementations, the power management system 225 includes a PA supply control circuit that controls the supply voltages of the power amplifiers 231. For example, the power management system 225 can be configured to change the supply voltage(s) provided to one or more of the power amplifiers 231 to improve efficiency, such as power added efficiency (PAE).

As shown in FIG. 15, the power management system 225 receives a battery voltage from the battery 228. The battery 228 can be any suitable battery for use in the wireless communication device 220, including, for example, a lithium-ion battery.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might,"

"may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A bulk acoustic wave device configured to excite an overtone mode as a main mode, the bulk acoustic wave device comprising:

a first electrode;

a piezoelectric layer positioned over the first electrode;

a second electrode positioned such that the piezoelectric layer is located between the first electrode and second electrode; and at least one temperature compensation layer configured to provide temperature compensation for the bulk acoustic wave device, the at least one temperature compensation layer having a thickness that is a multiple of one thirty-second of a wavelength of an acoustic wave propagating through the at least one temperature compensation layer, the bulk acoustic wave device configured to excite the overtone mode as the main mode, the piezoelectric layer being thicker than the at least one temperature compensation layer.

2. The bulk acoustic wave device of claim 1 wherein at least one temperature compensation layer is positioned between the first electrode and the second electrode.

3. The bulk acoustic wave device of claim 1 wherein the thickness of the at least one temperature compensation layer is not a multiple of one sixteenth of the wavelength.

4. The bulk acoustic wave device of claim 1 wherein the at least one temperature compensation layer provides provide temperature compensation for the bulk acoustic wave device such that a temperature coefficient of frequency of the bulk acoustic wave device is in a range of −2 ppm/° C. to −19 ppm/° C.

5. The bulk acoustic wave device of claim 4 wherein the at least one temperature compensation layer provides provide temperature compensation for the bulk acoustic wave device such that the temperature coefficient of frequency of the bulk acoustic wave device is in a range of −10 ppm/° C. to −15 ppm/° C.

6. The bulk acoustic wave device of claim 1 wherein a total thickness of the piezoelectric layer and the at least one temperature compensation layer is sufficiently thick to excite a second overtone mode as the main mode of the bulk acoustic wave device.

7. The bulk acoustic wave device of claim 1 wherein a total thickness of the piezoelectric layer and the at least one temperature compensation layer is sufficiently thick to excite a third overtone mode as the main mode of the bulk acoustic wave device.

8. The bulk acoustic wave device of claim 1 wherein the at least one temperature compensation layer is a silicon oxide layer.

9. The bulk acoustic wave device of claim 1 wherein the piezoelectric layer includes aluminum nitride.

10. The bulk acoustic wave device of claim 1 wherein the thickness of the at least one temperature compensation layer is sufficiently thick to provide a temperature coefficient of frequency variation of less than 1 ppm/° C.

11. The bulk acoustic wave device of claim 1 wherein a thickness of the piezoelectric layer is a multiple of one sixteenth of a wavelength of an acoustic wave propagating through the piezoelectric layer.

12. The bulk acoustic wave device of claim 1 wherein the at least one temperature compensation layer is in contact with the second electrode and the piezoelectric layer.

13. The bulk acoustic wave device of claim 1 wherein the at least one temperature compensation layer includes a first temperature compensation layer positioned between the second electrode and the piezoelectric layer and a second temperature compensation layer positioned between the first electrode and the piezoelectric layer.

14. The bulk acoustic wave device of claim 1 wherein a resonant frequency of the overtone mode is in a range from 5 gigahertz to 12 gigahertz.

15. An acoustic wave filter comprising:

a bulk acoustic wave device including a first electrode, a piezoelectric layer positioned over the first electrode, a second electrode positioned such that the piezoelectric layer is located between the first electrode and second electrode, and at least one temperature compensation layer configured to provide temperature compensation for the bulk acoustic wave device, the at least one temperature compensation layer having a thickness that is a multiple of one thirty-second of a wavelength of an acoustic wave propagating through the at least one temperature compensation layer, the bulk acoustic wave device configured to excite an overtone mode as a main mode; and a plurality of additional acoustic wave resonators, the bulk acoustic wave device and the plurality of additional acoustic wave resonators together configured to filter a radio frequency signal.

16. The acoustic wave filter of claim 15 wherein the thickness of the piezoelectric layer is a multiple of one sixteenth of a wavelength of an acoustic wave propagating through the piezoelectric layer.

17. The acoustic wave filter of claim 15 wherein the at least one temperature compensation layer provides provide temperature compensation for the bulk acoustic wave device such that a temperature coefficient of frequency of the bulk acoustic wave device is in a range of −2 ppm/° C. to −19 ppm/° C.

18. The acoustic wave filter of claim 15 wherein the at least one temperature compensation layer is in contact with the second electrode and the piezoelectric layer.

19. The acoustic wave filter of claim 15 wherein the at least one temperature compensation layer includes a first temperature compensation layer positioned between the second electrode and the piezoelectric layer and a second temperature compensation layer positioned between the first electrode and the piezoelectric layer.

20. A radio frequency module comprising:

a filter including a bulk acoustic wave device configured to excite an overtone mode as a main mode, the bulk acoustic wave device including a first electrode, a piezoelectric layer positioned over the first electrode, a second electrode positioned such that the piezoelectric layer is located between the first electrode and second electrode, and at least one temperature compensation layer configured to provide temperature compensation for the bulk acoustic wave device, the at least one temperature compensation layer having a thickness that is a multiple of one thirty-second of a wavelength of an acoustic wave propagating through the at least one temperature compensation layer, the bulk acoustic wave device configured to excite the overtone mode as the main mode, the piezoelectric layer being thicker than the at least one temperature compensation layer;

radio frequency circuitry; and a package structure enclosing the filter and the radio frequency circuitry.

* * * * *